(12) United States Patent
Higashide

(10) Patent No.: US 10,608,782 B2
(45) Date of Patent: Mar. 31, 2020

(54) WIRELESS RECEIVER AND WIRELESS TRANSMITTER

(71) Applicant: Funai Electric Co., Ltd., Daito, Osaka (JP)

(72) Inventor: Atsushi Higashide, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 237 days.

(21) Appl. No.: 15/691,067

(22) Filed: Aug. 30, 2017

(65) Prior Publication Data

US 2018/0076927 A1    Mar. 15, 2018

(30) Foreign Application Priority Data

Sep. 13, 2016    (JP) .................................. 2016-179005

(51) Int. Cl.
*H04L 1/00* (2006.01)
*H04L 1/20* (2006.01)
(Continued)

(52) U.S. Cl.
CPC ...... *H04L 1/0045* (2013.01); *H03M 13/2906* (2013.01); *H03M 13/2933* (2013.01); *H03M 13/353* (2013.01); *H04L 1/0009* (2013.01); *H04L 1/0025* (2013.01); *H04L 1/0026* (2013.01); *H04L 1/0041* (2013.01); *H04L 1/0059* (2013.01); *H04L 1/0064* (2013.01); *H04L 1/20* (2013.01);
(Continued)

(58) Field of Classification Search
CPC ....... H04L 1/0045; H04L 1/20; H04L 1/0064; H04L 1/0059; H04L 1/0041; H04L 1/0026; H04L 1/0025; H04L 1/0009; H03M 13/353; H03M 13/2933; H03M 13/2906; H03M 13/1102; H03M 13/2936; H03M 13/1515; H03M 13/41; H04N 19/89

See application file for complete search history.

(56) References Cited

U.S. PATENT DOCUMENTS

| 6,009,553 A | * | 12/1999 | Martinez | ............... H04L 1/0009 714/784 |
| 2003/0101408 A1 | * | 5/2003 | Martinian | ............. H03M 13/03 714/776 |
| 2008/0144553 A1 | * | 6/2008 | Shao | ..................... H04W 28/06 370/310 |

FOREIGN PATENT DOCUMENTS

| EP | 0797327 A2 | 9/1997 |
| JP | 2014-138230 A | 7/2014 |
| WO | 2010-056569 A2 | 5/2010 |

OTHER PUBLICATIONS

Extended European Search Report of the corresponding European Application No. 17190506.0, dated Feb. 19, 2018.

* cited by examiner

*Primary Examiner* — April Y Blair
*Assistant Examiner* — Rong Tang
(74) *Attorney, Agent, or Firm* — Global IP Counselors, LLP

(57) ABSTRACT

A wireless receiver includes a wireless communication component and a controller. The wireless communication component receives from a wireless transmitter a wireless signal that includes content data and encoded data having first error correction information and second error correction information of a different type from that of the first error correction information, for correcting errors in the content data. The controller determines which of the first error correction information and the second error correction infor- (Continued)

mation is to be given priority based on the signal quality of the wireless signal.

19 Claims, 10 Drawing Sheets

(51) Int. Cl.
*H03M 13/35* (2006.01)
*H03M 13/29* (2006.01)
*H03M 13/11* (2006.01)
*H04N 19/89* (2014.01)
*H03M 13/15* (2006.01)
*H03M 13/41* (2006.01)

(52) U.S. Cl.
CPC .... *H03M 13/1102* (2013.01); *H03M 13/1515* (2013.01); *H03M 13/2936* (2013.01); *H03M 13/41* (2013.01); *H04N 19/89* (2014.11)

FIRST EMBODIMENT

SECOND AND THIRD EMBODIMENTS

THIRD EMBODIMENT

FOURTH EMBODIMENT

WIRELESS RECEIVER AND WIRELESS TRANSMITTER

CROSS-REFERENCE TO RELATED APPLICATIONS

This application claims priority to Japanese Patent Application No. 2016-179005 filed on Sep. 13, 2016. The entire disclosure of Japanese Patent Application No. 2016-179005 is hereby incorporated herein by reference.

BACKGROUND

Field of the Invention

The present invention generally relates to a wireless receiver and a wireless transmitter. More specifically, the present invention relates to a wireless receiver and a wireless transmitter equipped with a wireless communication component.

Background Information

Wireless transmission methods and wireless transmitters equipped with a wireless communication component are conventionally known in the art (see Japanese Laid-Open Patent Application Publication No. 2014-138230 (Patent Literature 1), for example).

The above-mentioned Patent Literature 1 discloses a wireless receiver (broadcast receiver) equipped with a wireless communication component (tuner). This wireless receiver comprises a wireless communication component (tuner) for receiving broadcast signals that include broadcast data and error correction information, a demodulation circuit for demodulating the broadcast signals received by the wireless communication component, and a controller that adjusts the ratio of broadcast data in a broadcast signal outputted from the wireless communication component to the demodulation circuit, according to the signal level of the broadcast signal received by the wireless communication component, and also adjusts the width of a guard interval added to the broadcast signal in order to suppress interference with the broadcast signal. Also, the controller adjusts the ratio of broadcast data in a broadcast signal by adjusting the amount of error correction information.

SUMMARY

Various kinds of error occur during the transmission and receipt of data (such as random errors that occur sporadically during the transmission and receipt of data, burst errors that occur locally during the transmission and receipt of data, etc.). Also, error correction information varies with the type of error. In the above-mentioned Patent Literature 1, since the overriding type of error during the receipt of broadcast signals is random errors, a large amount of error correction information that is effective against random errors is included, and a problem is that error correction cannot be carried out properly for some types of error.

One object of the present disclosure is to provide a wireless receiver and a wireless transmitter with which error correction can be carried out properly for a number of error types.

In view of the state of the known technology and in accordance with an aspect of the present disclosure, a wireless receiver comprises a wireless communication component and a controller. The wireless communication component receives from a wireless transmitter a wireless signal that includes content data and encoded data having first error correction information and second error correction information of a different type from that of the first error correction information, for correcting errors in the content data. The controller determines which of the first error correction information and the second error correction information is to be given priority based on the signal quality of the wireless signal.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment

First, the configurations of a wireless receiver 100 and a wireless transmitter 200 pertaining to a first embodiment of the present disclosure will be described through reference to FIGS. 1 to 4.

Figure 1:
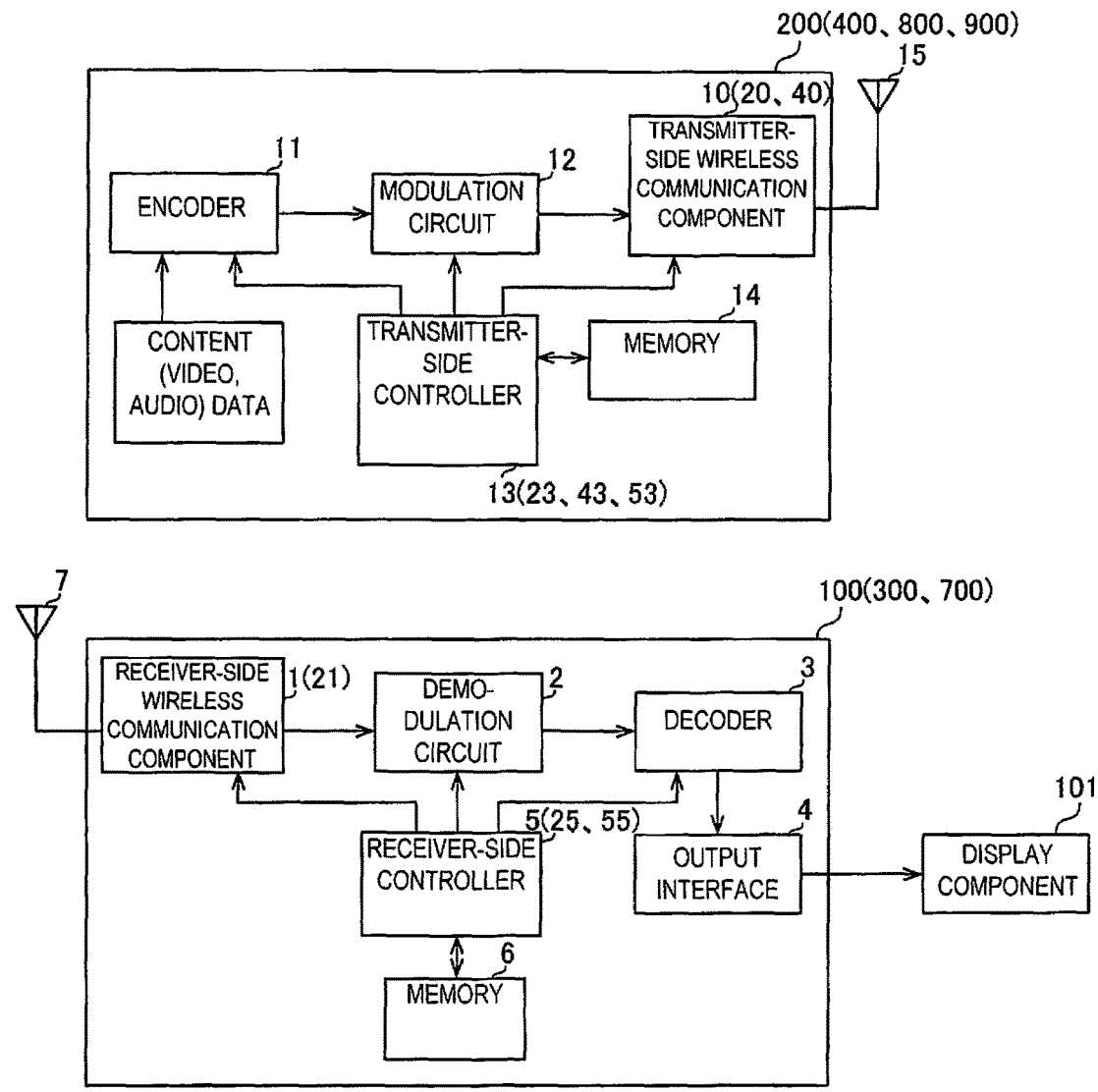
FIG. 1 is a block diagram of the configuration of the wireless receiver and wireless transmitter pertaining to the first, second, fourth, and fifth embodiments of the present disclosure.

As shown in FIG. 1, the wireless receiver 100 comprises a receiver-side wireless communication component 1. The wireless receiver 100 is also provided with a demodulation circuit 2, a decoder 3, an output interface 4, a receiver-side controller 5, and a memory 6. The receiver-side wireless communication component 1 and the receiver-side controller 5 are examples of the "wireless communication component of a wireless receiver" and the "controller of a wireless receiver" in the present disclosure. In the illustrated embodiment, the receiver-side controller 5 includes an electric controller, such as a microcomputer or processor with a control program that controls the various components of the wireless receiver 100. Also, the receiver-side wireless communication component 1 includes an electric circuit, such as an RF (radio-frequency) circuit.

The receiver-side wireless communication component 1 is connected to a receiver-side antenna 7, and is configured to receive wireless signals from the wireless transmitter 200 via the receiver-side antenna 7. The receiver-side wireless communication component 1 is configured to output the received wireless signals to the demodulation circuit 2. The signal outputted from the demodulation circuit 2 is transmitted through a decoder 3 and the output interface 4 to an external display component 101.

The wireless transmitter 200 comprises a transmitter-side wireless communication component 10. The wireless transmitter 200 is also provided with an encoder 11, a modulation circuit 12, a transmitter-side controller 13, and a memory 14. Content data, such as video and audio data, is transmitted through the encoder 11 and the modulation circuit 12 to the transmitter-side controller 13. The transmitter-side wireless communication component 10 and the transmitter-side controller 13 are examples of the "wireless communication component of a wireless transmitter" and the "controller of a wireless transmitter" in the present disclosure. In the illustrated embodiment, the transmitter-side controller 13 includes an electric controller, such as a microcomputer or processor with a control program that controls the various components of the wireless transmitter 200. Also, the transmitter-side wireless communication component 10 includes an electric circuit, such as an RF (radio-frequency) circuit.

The transmitter-side wireless communication component 10 is connected to a transmitter-side antenna 15, and is configured to transmit wireless signals through the transmitter-side antenna 15 to the wireless receiver 100.

In the first embodiment here, "wireless signal" includes digital broadcast signals. In this case, "wireless receiver 100" includes a television set, a BD (Blu-Ray (registered trademark) disc) recorder, and the like. The "receiver-side wireless communication component 1" includes a tuner and the like.

Figure 2:
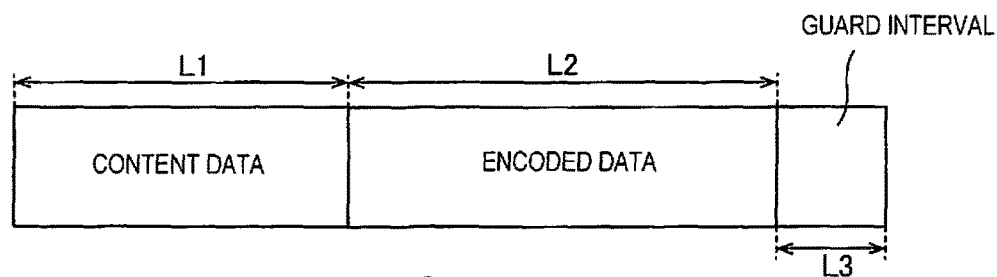
FIG. 2 shows the configuration of a wireless signal in the first to fifth embodiments of the present disclosure.

As shown in FIG. 2, the broadcast signal outputted from the receiver-side wireless communication component 1 (see FIG. 1) to the demodulation circuit 2 (see FIG. 1) is subjecting to convolutional coding, and includes content data, encoded data, and a guard interval. The term "encoded data" refers to a redundant portion that is added to a wireless signal in order to suppress the occurrence of errors when a wireless signal that has undergone convolutional coding is demodulated. The term "guard interval" refers to a redundant portion that is added to a wireless signal in order to suppress interference between wireless signals when a plurality of wireless signals are transmitted continuously. L1, L2, and L3 in FIG. 2 are the amounts of content data, encoded data, and guard interval data, respectively.

As shown in FIG. 1, the demodulation circuit 2 is configured to demodulate the wireless signal outputted from the receiver-side wireless communication component 1, and output the result to the decoder 3. The decoder 3 is configured to decode the wireless signal demodulated by the demodulation circuit 2, and output the result to the output interface 4. The output interface 4 is configured to output the content data included in the wireless signal received from the decoder 3, to the display component 101. The wireless transmitter 200 is configured so that, when there is a change to the settings, such as the coded rate or the amount of guard interval data, the wireless receiver 100 is notified of the change in settings, after which the content data is outputted to the wireless receiver 100. The "display component 101" includes a television set or other such display device.

The receiver-side controller 5 is provided in order to control the various parts of the wireless receiver 100. The memory 6 is provided to store various kinds of data and various programs executed by the receiver-side controller 5.

The encoder 11 of the wireless transmitter 200 is configured to encode the inputted content data. The modulation circuit 12 is configured to change the amplitude, frequency, or phase of a carrier wave based on the signal outputted from the encoder 11.

The transmitter-side controller 13 is provided in order to control the various parts of the wireless transmitter 200. The memory 14 is provided to store various kinds of data and various programs executed by the transmitter-side controller 13.

The transmitter-side controller 13 is configured to perform control to adjust the coded rate and the guard ratio according to the signal quality of the wireless signal received by the receiver-side wireless communication component 1. As shown in FIG. 2, the "coded rate" is the proportion of content data to encoded data and the content data that has undergone convolutional coding, and is a numerical value expressed by L1/(L1+L2). The "guard ratio" is the proportion of the amount of information in the guard interval (L3) to the amount of information in the portion of the wireless signal containing valid information (the portion containing content data and encoded data) (L1+L2), and is a numerical value expressed by L3/(L1+L2).

Figure 3A:
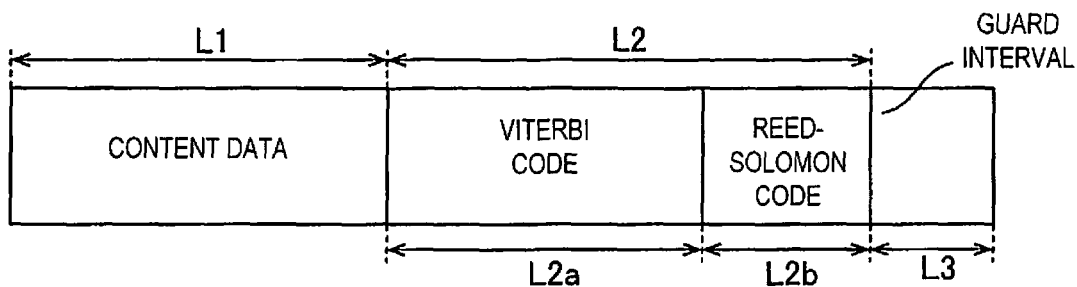
FIGS. 3A, 3B and 3C illustrate the change in the makeup of a wireless signal in the first embodiment of the present disclosure.
Figure 3B:
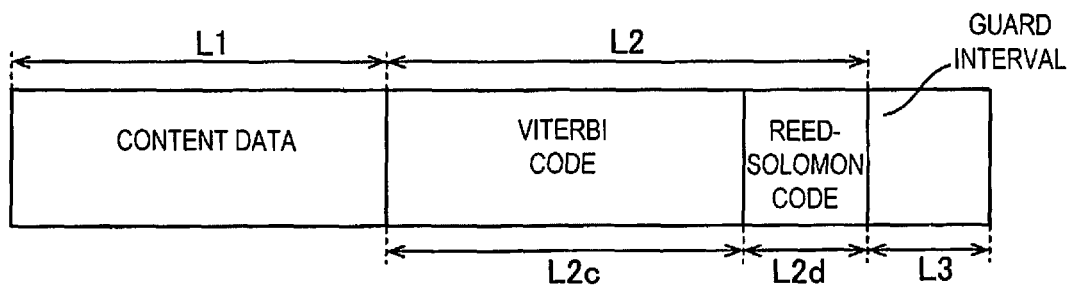
Figure 3C:
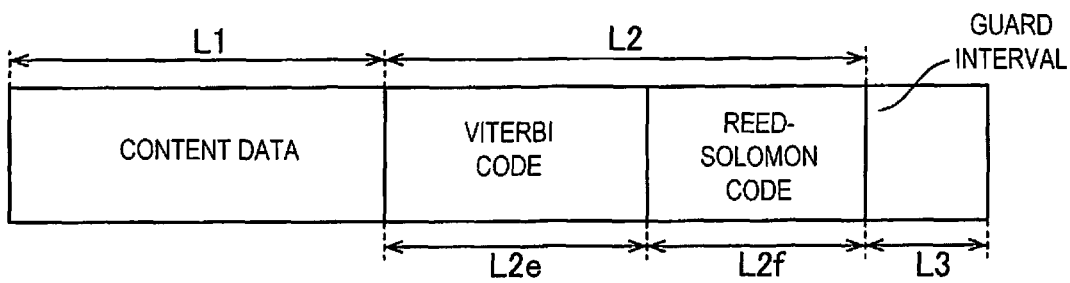

As shown in FIGS. 3A, 3B and 3C, in the first embodiment, the encoded data is made up of Viterbi code (first error correction information) for correcting errors in content data, and Reed-Solomon code (second error correction information). More specifically, the encoded data is made up of linked Viterbi code and Reed-Solomon code. As shown in FIG. 3A, a wireless signal in which the amount of information of Viterbi code is L2a and the amount of information of Reed-Solomon code is L2b, with respect to the amount of information L2 in the encoded data as a whole, is inputted to the receiver-side wireless communication component 1 (see FIG. 1). Also, L2=L2a+L2b. The Viterbi code and Reed-Solomon code are examples of the "first error correction information" and "second error correction information" in the present disclosure, respectively.

With the first embodiment, the receiver-side controller 5 performs control to acquire information for adjusting the amount of information in the Viterbi code and the amount of information in the Reed-Solomon code, based on the signal quality of the wireless signal. More specifically, the receiver-side controller 5 performs control to increase the amount of information in the Viterbi code and decrease the amount of information in the Reed-Solomon code, or control to acquire information for decreasing the amount of information in the Viterbi code and the increasing the amount of information in the Reed-Solomon code.

Also, with the first embodiment, the receiver-side controller 5 performs control to acquire information for changing the amounts of information in the Viterbi code and Reed-Solomon code, based on the code error rate of the wireless signal. More specifically, the receiver-side controller 5 performs control to acquire information for increasing the amount of information in the Viterbi code and decreasing the amount of information in the Reed-Solomon code, or for decreasing the amount of information in the Viterbi code and increasing the amount of information in the Reed-Solomon code, when the code error rate is at or over a specific threshold. The code error rate is an example of the "signal quality" in the present disclosure.

More precisely, in the first embodiment, the receiver-side controller 5 performs control to compare the code error rate when the amount of information in the Viterbi code has been increased, with the code error rate when the amount of information in the Reed-Solomon code has been increased, and thereby to acquire information for increasing the information amount of the error correction information with the lower code error rate, and for changing the constituent ratio of the Viterbi code and Reed-Solomon code.

Also, the receiver-side controller 5 is configured so as to send the wireless transmitter 200 side information for adjusting the amount of information in the Viterbi code and Reed-Solomon code thus acquired. More specifically, the receiver-side controller 5 notifies the wireless transmitter 200 side whether the code error rate is lower when the amount of information in the Viterbi code is increased or when the amount of information in the Reed-Solomon code is increased.

Also, in the first embodiment, the transmitter-side controller 13 performs control to adjust the amount of information in the Viterbi code and the amount of information in the Reed-Solomon code based on the information for adjusting the amount of information in the Viterbi code and the amount of information in the Reed-Solomon code acquired by the wireless receiver 100 based on information related to the signal quality of the wireless signal acquired by the wireless receiver 100. More specifically, the transmitter-side controller 13 is configured to perform control to increase the amount of information for the error correction information with the lower code error rate based on the result of comparing, by the wireless receiver 100, the code error rate when the amount of information in the Viterbi code is increased with the code error rate when the amount of information in the Reed-Solomon code is increased.

Control Flow of Wireless Receiver and Wireless Transmitter

Figure 4:
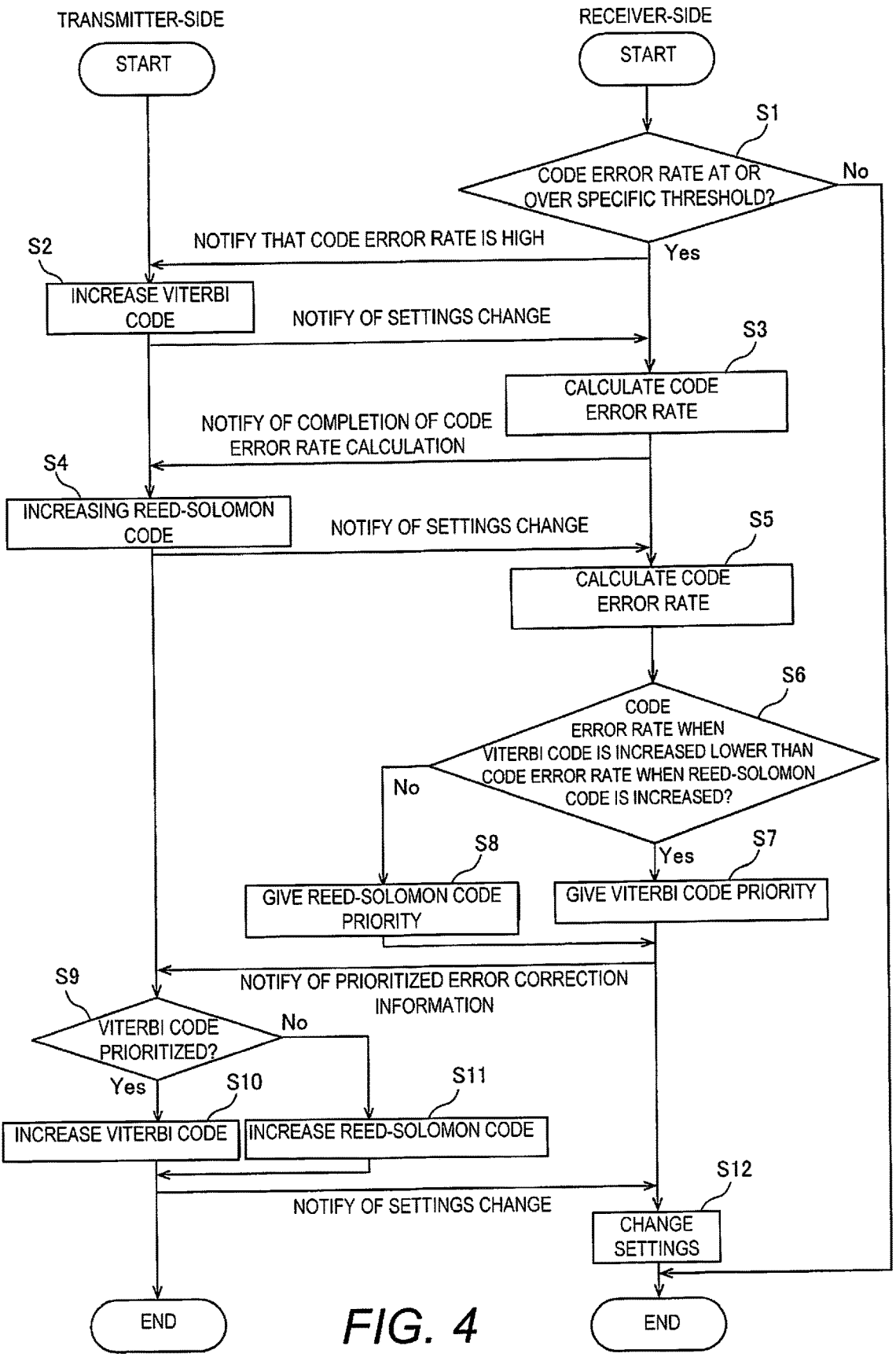
FIG. 4 illustrates the control flow for the wireless receiver and wireless transmitter in the first and fourth embodiments of the present disclosure.

The control flow for the wireless receiver 100 and the wireless transmitter 200 (the method for controlling the constituent ratio between Viterbi code and Reed-Solomon code) will now be described in detail through reference to FIGS. 1, 3, and 4.

First, in step S1, the receiver-side controller 5 determines whether or not the code error rate of the wireless signal received by the receiver-side wireless communication component 1 (see FIG. 1) via the receiver-side antenna 7 is at or over a specific threshold. If the code error rate is at or over the specific threshold, the receiver-side controller 5 notifies the wireless transmitter 200 side that the code error rate is at or over the specific threshold, and the flow proceeds to step S2.

Then, in step S2, the transmitter-side controller 13 increases the amount of information in the Viterbi code. More specifically, control is performed so that the wireless signal goes from the state in FIG. 3A to the state in FIG. 3B. That is, control is performed so that the amount of information in the Viterbi code goes from L2a to L2c, which is greater than L2a. Also, at this point the amount of information in the Reed-Solomon code goes from L2b to L2d, which is less than L2b. After this, the transmitter-side controller 13 notifies the wireless receiver 100 side of a change to the settings, and the flow proceeds to step S3.

Then, in step S3, the receiver-side controller 5 calculates the code error rate in the state in which the amount of information in the Viterbi code was increased in step S2. The code error rate calculated here is stored in the memory 6 (see FIG. 1). After this, the receiver-side controller 5 notifies the wireless transmitter 200 side that calculation of the code error rate is complete, and the flow proceeds to step S4.

Then, in step S4, the transmitter-side controller 13 increases the amount of information in the Reed-Solomon code. More specifically, control is performed so that the wireless signal goes from the state in FIG. 3B to the state in FIG. 3C. That is, control is performed so that the amount of information in the Reed-Solomon code goes from L2d to L2f, which is greater than L2b. Also, at this point the amount of information in the Viterbi code goes from L2c to L2e, which is less than L2a. After this, the transmitter-side controller 13 notifies the wireless receiver 100 side of a change to the settings, and the flow proceeds to step S5.

Then, in step S5, the receiver-side controller 5 calculates the code error rate in a state in which the amount of information in the Reed-Solomon code was increased in step S4. The code error rate calculated here is stored in the memory 6 (see FIG. 1).

Then, in step S6, the receiver-side controller 5 reads the code error rates calculated in steps S3 and S5 from the memory 6 (see FIG. 1) and compares them, and determines whether or not the code error rate calculated in step S3 is lower. If the code error rate calculated in step S3 is lower, the flow proceeds to step S7. If the code error rate calculated in step S3 is at or over the code error rate calculated in step S5, the flow proceeds to step S8.

In step S7, the receiver-side controller 5 performs control to give priority to Viterbi code. After this, the receiver-side controller 5 notifies the wireless transmitter 200 side that priority has been given to Viterbi code, and the flow proceeds to step S9.

In step S8, the receiver-side controller 5 performs control to give priority to Reed-Solomon code. After this, the receiver-side controller 5 notifies the wireless transmitter 200 side that priority has been given to Reed-Solomon code, and the flow proceeds to step S9.

In step S9, the transmitter-side controller 13 determines whether or not priority has been given to Viterbi code. If priority has been given to Viterbi code, the flow proceeds to step S10. If priority has not been given to Viterbi code, the flow proceeds to step S11.

In step S10, the transmitter-side controller 13 increases the amount of information in the Viterbi code. That is, control is performed so that the wireless signal goes into the state in FIG. 3B (e.g., first wireless signal). After this, the transmitter-side controller 13 notifies the wireless receiver 100 side of a change to the settings, and the flow proceeds to step S12.

In step S11, the transmitter-side controller 13 increases the amount of information in the Reed-Solomon code. That is, control is performed so that the wireless signal goes into the state in FIG. 3C (e.g., second wireless signal). After this, the transmitter-side controller 13 notifies the wireless receiver 100 side of a change to the settings, and the flow proceeds to step S12.

In step S12, the receiver-side controller 5 changes the settings to match the wireless signal transmitted from the wireless transmitter 200.

Also, in the first embodiment, the receiver-side controller 5 is configured to perform control to compare the code error rate when the amount of information in the Viterbi code has been increased and the amount of information in the Reed-Solomon code has been decreased with the code error rate when the amount of information in the Viterbi code has been decreased and the amount of information in the Reed-Solomon code has been increased, and thereby to acquire information for changing the constituent ratio of the amount of information in the Viterbi code and the amount of information in the Reed-Solomon code, so as not to change the amount of information in the encoded data. More specifically, as shown in FIGS. 3B and 3C, the total of the amount of information in the Viterbi code and the amount of information in the Reed-Solomon code is controlled by the transmitter-side controller 13 so as always to be L2. More precisely, when there is a change from the state in FIG. 3A to the state in FIG. 3B, the increase in the amount of information in the Viterbi code (L2c−L2a) is equal to the decrease in the amount of information in the Reed-Solomon code (L2b−L2d). Also, when there is a change from the state in FIG. 3B to the state in FIG. 3C, the decrease in the amount of information in the Viterbi code (L2c−L2e) is equal to the increase in the amount of information in the Reed-Solomon code (L2f−L2d). When the amount of information in the Viterbi code and the amount of information in the Reed-Solomon code are changed, there is no change in the amount of information in the wireless signal, which remains at L1+L2+L3.

Effect of the First Embodiment

The following effect can be obtained with the first embodiment.

As discussed above, in the first embodiment, the wireless receiver 100 is configured to comprise the receiver-side wireless communication component 1 and the receiver-side controller 5. The receiver-side wireless communication component 1 receives from the wireless transmitter 200 a wireless signal that includes content data and encoded data having Viterbi code and Reed-Solomon code that is of a different type from that of the Viterbi code, for correcting errors in the content data. The receiver-side controller 5 determines which of the Viterbi code and the Reed-Solomon code is to be given priority based on the signal quality of the wireless signal. For example, the receiver-side controller 5 performs control to adjust the amount of information in the Viterbi code and the amount of information in the Reed-Solomon code based on the signal quality of the wireless signal. Also, for example, the receiver-side controller 5 performs control so as to acquire information for adjusting the Viterbi code information amount and the Reed-Solomon code information amount, based on the signal quality of the wireless signal. Consequently, because the encoded data has Viterbi code and Reed-Solomon code, the amount of information in the Viterbi code and the amount of information in the Reed-Solomon code can be adjusted according to the type of error that has occurred, and information for effectively performing error correction on the error that has occurred can be acquired, allowing a plurality of types of error to be properly corrected, so error correction can be carried out properly.

Also, in the first embodiment, the wireless receiver 100 is configured such that the receiver-side controller 5 performs control to acquire information for increasing the amount of information in the Viterbi code and/or the Reed-Solomon code based on the signal quality of the wireless signal. Consequently, the error correction capability can be easily increased for a plurality of types of error by acquiring information for increasing the amount of information in the Viterbi code and/or the Reed-Solomon code, so error correction can be carried out effectively and the signal quality of the wireless signal can be better improved.

Also, in the first embodiment, the signal quality of the wireless signal includes the code error rate of the wireless signal. Specifically, the wireless receiver 100 is configured such that the receiver-side controller 5 performs control to acquire information for changing the amount of information in the Viterbi code and/or the Reed-Solomon code based on the code error rate of the wireless signal. Here, if noise or the like is mixed into the wireless signal, there will be a profound effect on the code error rate. Therefore, the proper error correction can be easily carried out by acquiring information for performing control of error correction based on the code error rate of the wireless signal.

Also, in the first embodiment, the receiver-side controller 5 determines which of the Viterbi code and the Reed-Solomon code is to be given priority when the code error rate is at or over a specific threshold. Specifically, the wireless receiver 100 is configured such that the receiver-side controller 5 performs control to acquire information for increasing the amount of information in the Viterbi code and/or the Reed-Solomon code when the code error rate is at or over a specific threshold. Consequently, the code error rate of the wireless signal can be easily improved.

Also, in the first embodiment, the receiver-side wireless communication component 1 receives from the wireless transmitter 200 the wireless signal (first wireless signal) in which the amount of information in the Viterbi code has been increased and the wireless signal (second wireless signal) in which the amount of information in the Reed-Solomon code has been increased. The controller gives priority to one of the Viterbi code and the Reed-Solomon code with a lower code error rate, by comparing the code error rates of the wireless signals (first and second wireless signals) with each other. For example, the wireless receiver 100 is configured such that the receiver-side controller 5 performs control to compare the code error rate when the amount of information in the Viterbi code has been increased with the code error rate when the amount of information in the Reed-Solomon code has been increased, and thereby to acquire information for increasing the information amount of the error correction information with the lower code error rate, and for changing the constituent ratio of the Viterbi code and the Reed-Solomon code. Consequently, it can be determined whether it is more effective to increase the amount of information in the Viterbi code or to increase the amount of information in the Reed-Solomon code for an error that has occurred, so error correction capability can be increased even more easily.

Also, in the first embodiment, the receiver-side wireless communication component 1 receives from the wireless transmitter 200 the wireless signal (first wireless signal) in which the amount of information in the Viterbi code has been increased and the amount of information in the Reed-Solomon code has been decreased so as not to change the amount of information in the encoded data and the wireless signal (second wireless signal) in which the amount of information in the Viterbi code has been decreased and the amount of the information in the Reed-Solomon code has been increased so as not to change the amount of information in the encoded data. The receiver-side controller 5 gives priority to one of the Viterbi code and the Reed-Solomon code with a lower code error rate, by comparing the code error rates of the wireless signals (first and second wireless signals) with each other. For example, the wireless receiver 100 is configured such that the receiver-side controller 5 performs control to compare the code error rate when the amount of information in the Viterbi code has been increased and the amount of information in the Reed-Solomon code has been decreased with the code error rate when the amount of information in the Reed-Solomon code has been decreased and the amount of information in the Reed-Solomon code has been increased, and thereby to acquire information for changing the constituent ratio of the Viterbi code and the Reed-Solomon code, so as not to change the amount of information in the encoded data. Consequently, the amount of information in the encoded data does not change, so the proper error correction can be carried out while suppressing a decrease in the speed at which the wireless signal is received.

Also, in the first embodiment, the wireless receiver 100 is configured such that the wireless signal includes a digital broadcast signal. Consequently, error correction can be carried out properly in wireless communication by digital broadcast.

Also, in the first embodiment, the wireless receiver 100 is configured such that when the wireless signal includes a digital broadcast signal, the first error correction information includes Viterbi code and the second error correction information includes Reed-Solomon code. Here, in a digital broadcast, Viterbi code is effective against random errors, and Reed-Solomon code is effective against burst errors. Therefore, the error correction capability against both random errors and burst errors can be easily optimized in a digital broadcast by having the first error correction information include Viterbi code and the second error correction information include Reed-Solomon code.

Also, in the first embodiment, the receiver-side controller 5 notifies the wireless transmitter 200 of information regarding which of the Viterbi code and the Reed-Solomon code is to be given priority. For example, the wireless receiver 100 is configured such that the receiver-side controller 5 sends the wireless transmitter 200 side the acquired information for adjusting the amount of information in the Viterbi code and the amount of information in the Reed-Solomon code. Consequently, an information notification signal can be transmitted to the wireless transmitter 200 side upon completion of the acquisition of information by the receiver-side controller 5, so it is less likely that there will be a time difference between the completion of the acquisition of information by the receiver-side controller 5 and the notification of information to the wireless transmitter 200 side.

Also, in the first embodiment, the wireless transmitter 200 comprises the transmitter-side wireless communication component 10 and the transmitter-side controller 13. The transmitter-side wireless communication component 10 transmits the wireless signal to the wireless receiver 100. The transmitter-side controller 13 adjusts the amount of information in the Viterbi code and the amount of information in the Reed-Solomon code based on information regarding which of the Viterbi code and the Reed-Solomon code is to be given priority, acquired by the wireless receiver 100. Specifically, the transmitter-side controller 13 performs control so that the amount of information in the Viterbi code and the amount of information in the Reed-Solomon code are adjusted based on information for adjusting the amount of information in the Viterbi code and the amount of information in the Reed-Solomon code acquired by the wireless receiver 100 based on the signal quality of the wireless signal. Consequently, the signal quality of the wireless signal acquired by the wireless receiver 100 can be fed back to adjust the amount of information in the Viterbi code and the amount of information in the Reed-Solomon code, allowing error correction to be performed properly.

Also, in the first embodiment, the transmitter-side controller 13 changes the ratio of the amount of information in the Viterbi code and the amount of information in the Reed-Solomon code based on the information regarding which of the Viterbi code and the Reed-Solomon code is to be given priority, acquired by the wireless receiver 100.

Also, in the first embodiment, the transmitter-side controller 13 changes the ratio of the amount of information in the Viterbi code and the amount of information in the Reed-Solomon code so as not to change the amount of information in the encoded data based on the information regarding which of the Viterbi code and the Reed-Solomon code is to be given priority, acquired by the wireless receiver 100.

Also, in the first embodiment, the transmitter-side controller 13 notifies the wireless receiver 100 of the change to the setting (setting change) in the encoded data.

Second Embodiment

The configuration of a wireless receiver 300 and a wireless transmitter 400 pertaining to a second embodiment will now be described through reference to FIGS. 1, 5, and 6. Unlike in the first embodiment, the wireless receiver 300 and the wireless transmitter 400 in this second embodiment are configured such that the amount of information of either the first error correction information or the second error correction information is set to zero. In the drawings, those components that are the same as in the first embodiment above are numbered the same.

In the second embodiment, the wireless signal includes a signal produced by a wireless LAN (local area network). In this case, the wireless receiver 300 (see FIG. 1) and the wireless transmitter 400 (see FIG. 1) include a smart phone, a PC, etc. Also, the wireless receiver 300 is connected to the wireless transmitter 400 by WiFi (Wireless Fidelity (registered trademark)) via a router (not shown).

Figure 5A:
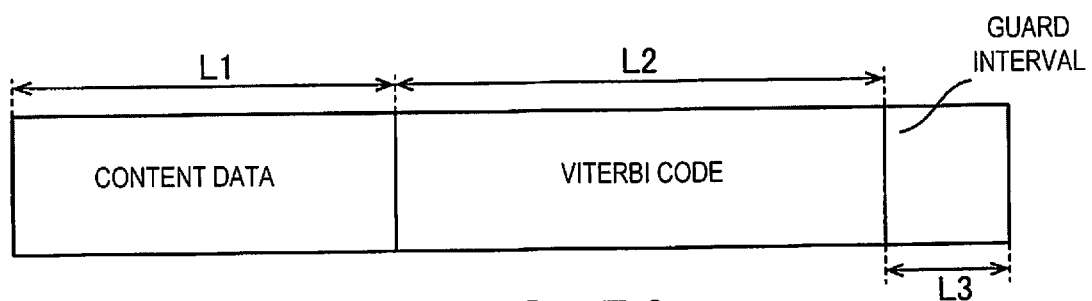
FIGS. 5A and 5B illustrate the change in the makeup of a wireless signal in the second and third embodiments of the present disclosure.
Figure 5B:
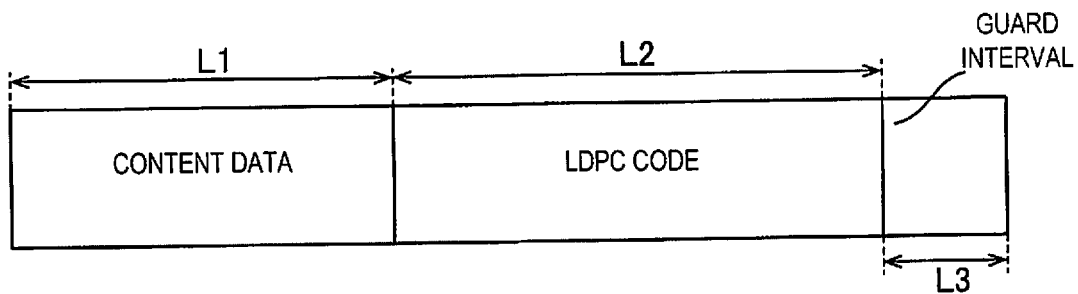

As shown in FIGS. 5A and 5B, in the second embodiment, the encoded data includes Viterbi code that is first error correction information, and LDPC (low-density parity-check) code that is second error correction information, for correcting errors in the content data. More specifically, the wireless transmitter 400 (see FIG. 1) is configured so that either Viterbi code or LDPC code can be selected as error correction information. The Viterbi code and LDPC code are examples of the "first error correction information" and "second error correction information" in the present disclosure, respectively.

Also, in the second embodiment, a receiver-side controller 25 compares the code error rate when the amount of information in the Viterbi code is set to zero and the amount of information in the LDPC code is increased with the code error rate when the amount of information in the LDPC code is set to zero and the amount of information in the Viterbi code is increased. Consequently, information is acquired for changing the constituent ratio between Viterbi code and LDPC code.

Control Flow of Wireless Receiver and Wireless Transmitter

The control flow of the wireless receiver 300 and the wireless transmitter 400 (the method for controlling the constituent ratio between Viterbi code and LDPC code) will now be described in detail through reference to FIGS. 1, 5, and 6.

Figure 6:
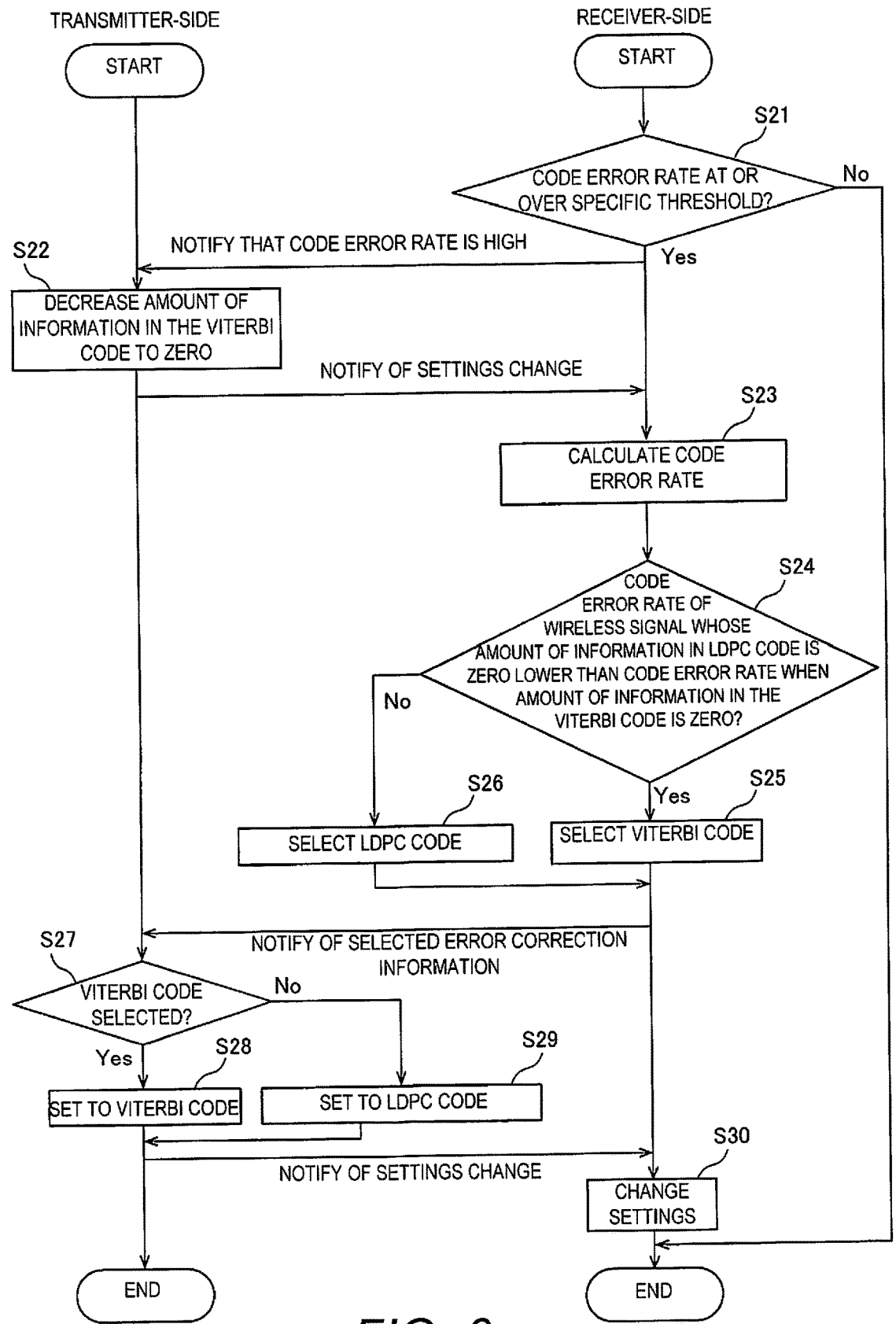
FIG. 6 illustrates the control flow for the wireless receiver and wireless transmitter in the second and fifth embodiments of the present disclosure.

As shown in FIG. 6, first, in step S21, the receiver-side controller 25 determines whether or not the code error rate of the wireless signal (see FIG. 5A) (first wireless signal) received by a receiver-side wireless communication component 21 (see FIG. 1) via the receiver-side antenna 7 (see FIG. 1) is at or over a specific threshold. If the code error rate is at or over the specific threshold, the wireless transmitter 400 side is notified that the code error rate is at or over the specific threshold, and the flow proceeds to step S22. The code error rate calculated at this point is stored in the memory 6 (see FIG. 1). The receiver-side wireless communication component 21 and the receiver-side controller 25 are examples of the "wireless communication component of the wireless receiver" and the "controller of the wireless receiver" in the present disclosure, respectively.

Then, in step S22, a transmitter-side controller 23 decreases the amount of information in the Viterbi code to zero. More specifically, the wireless signal transmitted by the transmitter-side wireless communication component 20 (see FIG. 1) via the transmitter-side antenna 15 (see FIG. 1) is controlled to go from the state in FIG. 5A to the state in FIG. 5B (second wireless signal). That is, the amount of information in the Viterbi code is controlled to go from L2 to zero, and the amount of information in the LDPC code is controlled to go from zero to L2. After this, the transmitter-side controller 23 notifies the wireless receiver 300 side of a change in the settings, and the flow proceeds to step S3. The transmitter-side wireless communication component 20 and the transmitter-side controller 23 are examples of the "wireless communication component of the wireless transmitter" and the "controller of the wireless transmitter" in the present disclosure, respectively.

Then, in step S23, the receiver-side controller 25 calculates the code error rate in a state in which the amount of information in the Viterbi code was decreased to zero in step S22. The code error rate calculated at this point is stored in the memory 6 (see FIG. 1).

Then, in step S24, the receiver-side controller 25 reads the code error rates calculated in steps S21 and S23 from the memory 6 (see FIG. 1) and compares them, and determines whether or not the code error rate calculated in step S21 (the code error rate when the amount of information in the LDPC code is zero) is lower. If the code error rate calculated in step S21 is lower, the flow proceeds to step S25. If the code error rate calculated in step S21 is at or over the code error rate calculated in step S23 (the code error rate when the amount of information in the Viterbi code is zero), the flow proceeds to step S26.

In step S25, the receiver-side controller 25 selects Viterbi code as the error correction information. After this, the wireless transmitter 400 side is notified that Viterbi code has been selected, and the flow proceeds to step S27.

In step S26, the receiver-side controller 25 selects LDPC code as the error correction information. After this, the wireless transmitter 400 side is notified that LDPC code has been selected, and the flow proceeds to step S27.

In step S27, the transmitter-side controller 23 determines whether or not the receiver-side controller 25 has selected Viterbi code. If the receiver-side controller 25 has selected Viterbi code, the flow proceeds to step S28, and if the receiver-side controller 25 has selected LDPC code, the flow proceeds to step S29.

In step S28, the transmitter-side controller 23 sets the wireless signal transmitted to the wireless receiver 300 to the state in FIG. 5A. After this, the wireless receiver 300 side is notified that a setting change has been made, and the flow proceeds to step S30.

In step S29, the transmitter-side controller 23 sets the wireless signal transmitted to the wireless receiver 300 to the state in FIG. 5B. After this, the wireless receiver 300 side is notified that a setting change has been made, and the flow proceeds to step S30.

In step S30, the receiver-side controller 25 changes the settings to match the wireless signal transmitted from the wireless transmitter 400.

The rest of the configuration of the second embodiment is the same as in the first embodiment above.

Effect of Second Embodiment

The following effect can be obtained with the second embodiment.

In the second embodiment, as discussed above, the receiver-side wireless communication component 21 receives from the wireless receiver 300 the wireless signal (first wireless signal) in which the amount of the information in the Viterbi code has been increased and the amount of information in the LDPC code has been lowered to approximately zero so as not to change the amount of information in the encoded data and the wireless signal (second wireless signal) in which the amount of the information in the LDPC code has been increased and the amount of information in the Viterbi code has been lowered to approximately zero so as not to change the amount of information in the encoded data. The receiver-side controller 25 gives priority to one of the Viterbi code or the LDPC code with a lower code error rate, by comparing the code error rates of the wireless signals (first and second wireless signals) with each other. Specifically, the wireless receiver 300 is configured such that the receiver-side controller 25 performs control to compare the code error rate when the amount of information in the Viterbi code has been set to substantially zero and the amount of information in the LDPC code has been increased so as not to change the amount of information in the encoded data with the code error rate when the amount of information in the LDPC code has been set to substantially zero and the amount of information in the Viterbi code has been increased so as not to change the amount of information in the encoded data, and thereby to acquire information for changing the constituent ratio of the Viterbi code and the LDPC code. Consequently, the error correction capability can be more effectively enhanced when only a valid error has occurred in either the Viterbi code or the LDPC code.

Also, in the second embodiment, the wireless receiver 300 is configured such that the wireless signal includes a signal produced by a wireless LAN. This allows error correction to be properly performed in wireless communication over a wireless LAN.

Also, in the second embodiment, the wireless receiver 300 is configured such that when the wireless signal includes a signal produced by a wireless LAN, the first error correction information includes Viterbi code, and the second error correction information includes LDPC code. Here, in a wireless LAN, Viterbi code is effective against random errors, and LDPC code is effective against burst errors. Therefore, the error correction capability against both random errors and burst errors in a wireless LAN can be easily optimized by having the first error correction information include Viterbi code and the second error correction information include LDPC code.

Also, in the second embodiment, the wireless transmitter 400 is configured such that the transmitter-side controller 23 increases one of the amounts of the information in the Viterbi code and the LDPC code and lower the other one of the amounts of the information in the Viterbi code and the LDPC code to approximately zero so as not to change the amount of information in the encoded data based on the information regarding which of the Viterbi code and the LDPC code is to be given priority, acquired by the wireless receiver 300.

The rest of the effects of the second embodiment are the same as in the first embodiment above.

Third Embodiment

The configuration of a wireless receiver 500 and a wireless transmitter 600 pertaining to a third embodiment will now be described through reference to FIGS. 5A, 5B, 7, and 8. Unlike in the first and second embodiments, the wireless receiver 500 and the wireless transmitter 600 in this third embodiment each comprise two antennas for sending and receiving wireless signals. In the drawings, those components that are the same as in the second embodiment above are numbered the same.

Figure 7:
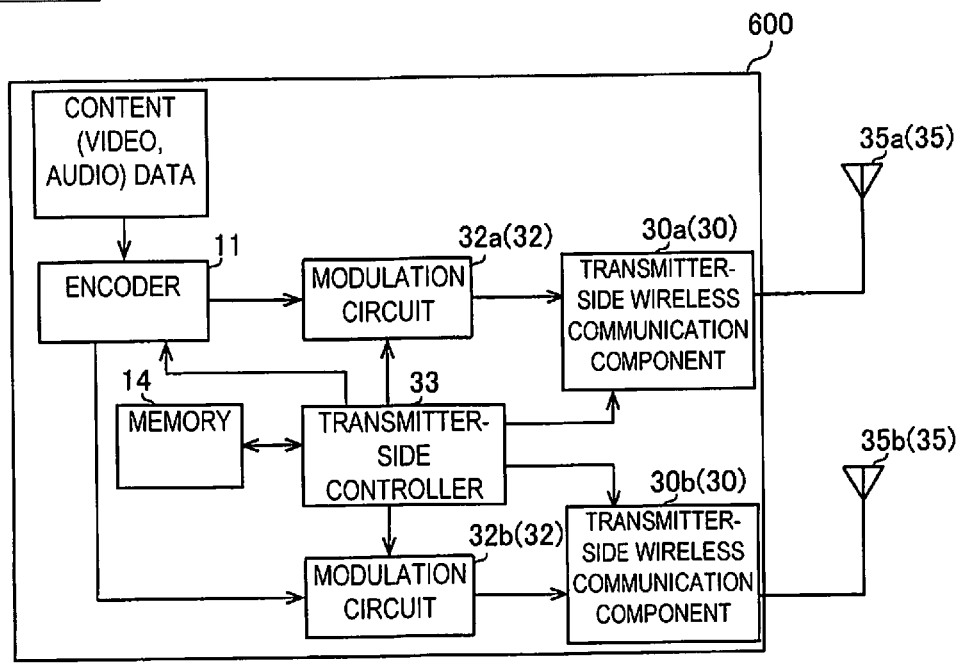
FIG. 7 is a block diagram of the configuration of the wireless receiver and wireless transmitter pertaining to the third embodiment of the present disclosure.
Figure 7:
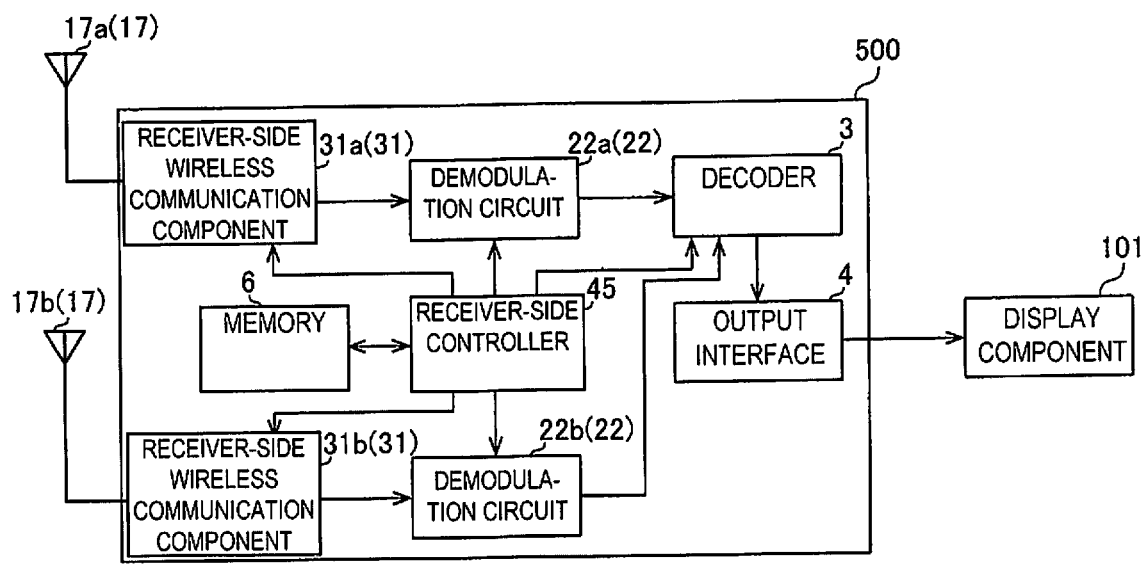

As shown in FIG. 7, in the third embodiment, the wireless receiver 500 comprises a plurality of receiver-side antennas 17 (such as multiple-input multiple-output (MIMO) of a wireless LAN) capable of receiving a plurality of sets of encoded data substantially at the same time. More specifically, the wireless receiver 500 comprises a first receiver-side antenna 17a and a second receiver-side antenna 17b. The first receiver-side antenna 17a and the second receiver-side antenna 17b are configured so that each one independently receives wireless signals. Also, reception by the first receiver-side antenna 17a and reception by the second receiver-side antenna 17b are performed in parallel. The receiver-side antennas 17, the first receiver-side antenna 17a, and the second receiver-side antenna 17b are examples of the "antenna of the wireless receiver" in the present disclosure.

A receiver-side wireless communication component 31 includes a receiver-side wireless communication component 31a and a receiver-side wireless communication component 31b. The receiver-side wireless communication component 31a is connected to the first receiver-side antenna 17a. The receiver-side wireless communication component 31b is connected to the second receiver-side antenna 17b. The receiver-side wireless communication component 31, the receiver-side wireless communication component 31a, and the receiver-side wireless communication component 31b are examples of the "wireless communication component of the wireless receiver" in the present disclosure.

A demodulation circuit 22 includes a first demodulation circuit 22a and a second demodulation circuit 22b. A wireless signal from the receiver-side wireless communication component 31a is demodulated by the first demodulation circuit 22a and sent to the decoder 3. A wireless signal from the receiver-side wireless communication component 31b is demodulated by the second demodulation circuit 22b and sent to the decoder 3.

The wireless transmitter 600 comprises a plurality of transmitter-side antennas 35 capable of transmitting a plurality of sets of encoded data at substantially the same time. More specifically, the wireless transmitter 600 comprises a first transmitter-side antenna 35a and a second transmitter-side antenna 35b. The first transmitter-side antenna 35a and the second transmitter-side antenna 35b are configured so that each one independently transmits wireless signals. Also, transmission by the first transmitter-side antenna 35a and transmission by the second transmitter-side antenna 35b are performed in parallel. The transmitter-side antennas 35, the first transmitter-side antenna 35a, and the second transmitter-side antenna 35b are examples of the "antenna of the wireless transmitter" in the present disclosure.

A transmitter-side wireless communication component 30 includes a transmitter-side wireless communication component 30a and a transmitter-side wireless communication component 30b. The transmitter-side wireless communication component 30a is connected to the first transmitter-side antenna 35a. The transmitter-side wireless communication component 30b is connected to the second transmitter-side antenna 35b. The transmitter-side wireless communication component 30, the transmitter-side wireless communication component 30a, and the transmitter-side wireless communication component 30b are examples of the "wireless communication component of the wireless transmitter" in the present disclosure.

A modulation circuit 32 includes a first modulation circuit 32a and a second modulation circuit 32b. A wireless signal that has been modulated by the first modulation circuit 32a is sent to the transmitter-side wireless communication component 30a. A wireless signal that has been modulated by the second modulation circuit 32b is sent to the transmitter-side wireless communication component 30b. Wireless signals are exchanged between the transmitter-side wireless communication component 30a and the receiver-side wireless communication component 31a. Also, wireless signals are exchanged between the transmitter-side wireless communication component 30b and the receiver-side wireless communication component 31b.

With the third embodiment, a receiver-side controller 45 compares the code error rates for a plurality of sets of encoded data received by the receiver-side antennas 17. The configuration is such that control is performed to acquire information for selecting the set of encoded data with the lowest code error rate. The receiver-side controller 45 is an example of the "controller of the wireless receiver" in the present disclosure.

Also, with the third embodiment, a transmitter-side controller 33 is configured to perform control to select the set of encoded data with the lowest code error rate among the plurality of sets of encoded data, based on information for adjusting the amount of information in the Viterbi code and the amount of information in the LDPC code, acquired by the wireless receiver 500 based on the signal quality of the wireless signal. That is, the transmitter-side controller 33 selects the encoded data with the lowest code error rate based on the result of comparing the code error rates for a plurality of sets of encoded data by the receiver-side controller 45. The transmitter-side controller 33 is an example of the "controller of the wireless transmitter" in the present disclosure.

Control Flow of Wireless Receiver and Wireless Transmitter

The control flow for the wireless receiver 500 and the wireless transmitter 600 (the method for controlling encoded data) will now be described in detail through reference to FIGS. 5A, 5B, 7, and 8.

Figure 8:
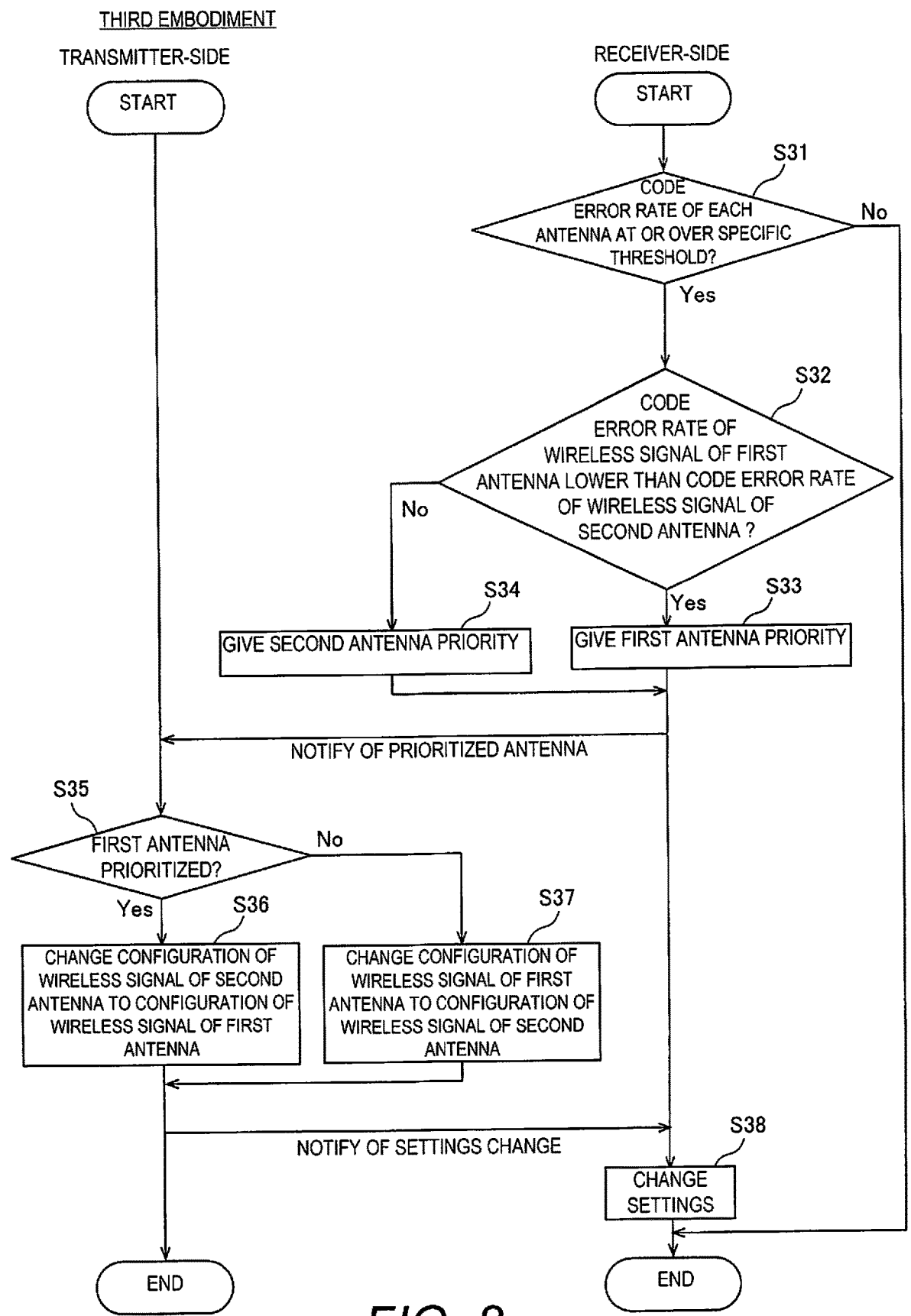
FIG. 8 illustrates the control flow for the wireless receiver and wireless transmitter in the third embodiment of the present disclosure.

As shown in FIG. 8, first, in step S31, the receiver-side controller 45 determines whether or not the code error rate of the wireless signal (see FIG. 5A) received by the receiver-side wireless communication component 31a (see FIG. 7) via the first receiver-side antenna 17a (see FIG. 7), and the code error rate of the wireless signal (see FIG. 5B) received by the receiver-side wireless communication component 31b via the second receiver-side antenna 17b (see FIG. 7) are each at or over a specific threshold. If each code error rate is at or over the specific threshold, the flow proceeds to step S32. The code error rates calculated here are stored in the memory 6 (see FIG. 7).

Then, in step S32, the receiver-side controller 45 reads the code error rate of the wireless signal received by the receiver-side wireless communication component 31*a* (see FIG. 7) via the first receiver-side antenna 17*a* (see FIG. 7), and the code error rate of the wireless signal received by the receiver-side wireless communication component 31*b* via the second receiver-side antenna 17*b* (see FIG. 7) from the memory 6 (see FIG. 7) and compares them, and determines whether or not the code error rate of the wireless signal received via the first receiver-side antenna 17*a* is lower. If the code error rate of the wireless signal received via the first receiver-side antenna 17*a* is lower, the flow proceeds to step S33. If the code error rate of the wireless signal received via the first receiver-side antenna 17*a* is at or over the code error rate of the wireless signal received via the second receiver-side antenna 17*b*, the flow proceeds to step S34.

In step S33, the receiver-side controller 45 gives priority to the wireless signal received via the first receiver-side antenna 17*a* (see FIG. 7). After this, the wireless transmitter 600 is notified that priority has been given to the first receiver-side antenna 17*a*, and the flow proceeds to step S35.

In step S34, the receiver-side controller 45 gives priority to the wireless signal received via the second receiver-side antenna 17*b* (see FIG. 7). After this, the wireless transmitter 600 is notified that priority has been given to the second receiver-side antenna 17*b*, and the flow proceeds to step S35.

In step S35, the transmitter-side controller 33 determines whether or not there has been a notification of priority being given to the wireless signal received via the first receiver-side antenna 17*a* (see FIG. 7). If there has been a notification of priority being given to the wireless signal received via the first receiver-side antenna 17*a*, the flow proceeds to step S36. If there has not been a notification of priority being given to the wireless signal received via the first receiver-side antenna 17*a*, the flow proceeds to step S37.

In step S36, the transmitter-side controller 33 performs control to change the configuration of the encoded data in the wireless signal transmitted by the second transmitter-side antenna 35*b* (see FIG. 7) to the configuration of the encoded data in the wireless signal transmitted by the first transmitter-side antenna 35*a* (see FIG. 7). That is, the amount of information in the LDPC code for the wireless signal transmitted by the second transmitter-side antenna 35*b* is changed from L2 to zero, and the amount of information in the Viterbi code is changed from zero to L2.

In step S37, the transmitter-side controller 33 performs control to change the configuration of the encoded data in the wireless signal transmitted by the first transmitter-side antenna 35*a* (see FIG. 7) to the configuration of the encoded data in the wireless signal transmitted by the second transmitter-side antenna 35*b* (see FIG. 7). That is, the amount of information in the Viterbi code for the wireless signal transmitted by the first transmitter-side antenna 35*a* is changed from L2 to zero, and the amount of information in the LDPC code is changed from zero to L2.

In step S38, the receiver-side controller 45 changes the settings to match the wireless signal transmitted from the wireless transmitter 600.

The rest of the configuration of the third embodiment is the same as in the first embodiment above.

Effect of Third Embodiment

The following effect can be obtained with the third embodiment.

In the third embodiment, as discussed above, the wireless receiver 500 further comprises a plurality of receiver-side antennas 17 configured to receive a plurality of sets of the encoded data at substantially the same time. The receiver-side controller 45 selects a set of the encoded data with the lowest code error rate by comparing the code error rates for the sets of the encoded data received by the receiver-side antennas 17. Specifically, the receiver-side controller 45 is configured to perform control to compare the code error rates for a plurality of sets of encoded data received by the receiver-side antennas 17, and thereby to acquire information for selecting the encoded data with the lowest code error rate. Consequently, compared to when a plurality of wireless signals (sets of encoded data) are continuously received by a single antenna, a plurality of wireless signals (sets of encoded data) can be received substantially at the same time by the receiver-side antennas 17. As a result, the code error rates of a plurality of wireless signals (sets of encoded data) can be compared easily and quickly.

In the third embodiment, as discussed above, the wireless transmitter 600 further comprises a plurality of transmitter-side antennas 35 configured to transmit a plurality of sets of the encoded data at substantially the same time. The transmitter-side controller 33 selects a set of the encoded data with the lowest code error rate based on information regarding which of the Viterbi code (first error correction information) and the LDPC code (second error correction information) is to be given priority, acquired by the wireless receiver. Specifically, the transmitter-side controller 33 performs control to select the encoded data with the lowest code error rate among the plurality of sets of encoded data, based on information for adjusting the amount of information in the Viterbi code and the amount of information in the LDPC code, acquired by the wireless receiver 500 based on signal quality of the wireless signal. With this configuration, a plurality of sets of encoded data can be transmitted at substantially the same time by a plurality of transmitter-side antennas 35, as opposed to when a plurality of sets of encoded data are transmitted continuously by a single antenna. As a result, a plurality of sets of encoded data can be transmitted quickly.

The rest of the effect of the third embodiment is the same as that in the first embodiment above.

Fourth Embodiment

The configuration of a wireless receiver 700 and a wireless transmitter 800 pertaining to a fourth embodiment will now be described through reference to FIGS. 1, 9A to 9C, and 10. Unlike in the first embodiment, the wireless receiver 700 and the wireless transmitter 800 in this fourth embodiment are configured to control the encoded data and to control part of the content data. In the drawings, those components that are the same as in the first embodiment above are numbered the same.

Figure 9A:
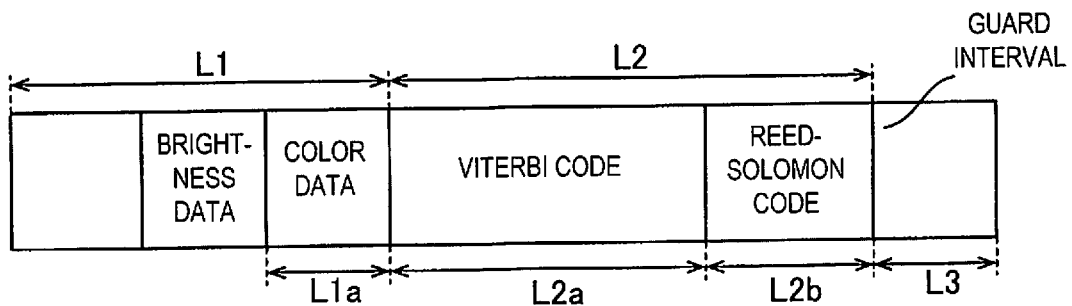
FIGS. 9A, 9B and 9C illustrate the change in the makeup of a wireless signal in the fourth embodiment of the present disclosure.
Figure 9B:
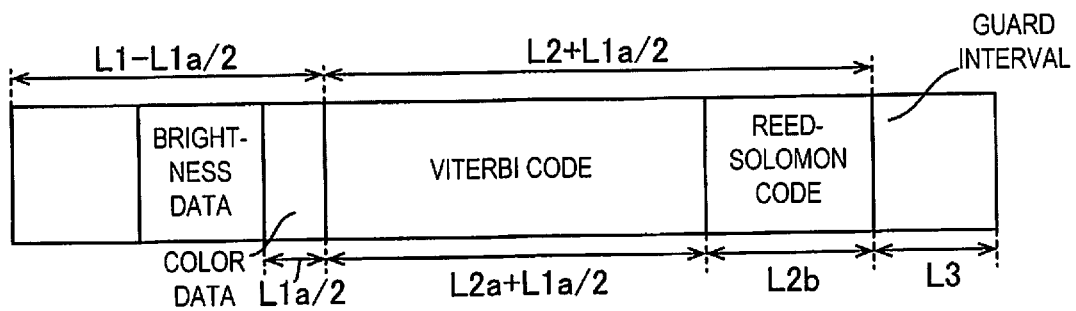
Figure 9C:
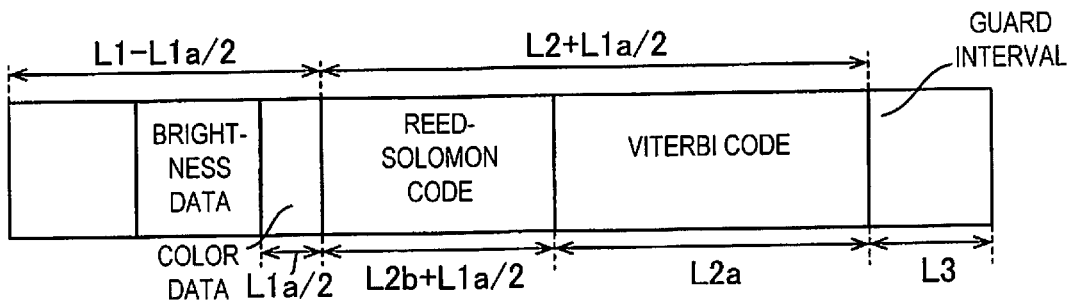

As shown in FIGS. 9A, 9B and 9C, the content data includes brightness data expressing the brightness of video, and color data expressing the color of the video.

In this fourth embodiment, a receiver-side controller 55 (see FIG. 1) compares the code error rate when the amount of information in the Viterbi code is increased with the code error rate when the amount of information in the Reed-Solomon code is increased, in a case in which the amount of information in color data has been decreased by thinning out part of the color data, so as not to change the total amount of information in the content data and encoded data. Consequently, the receiver-side controller 55 performs control to increase the amount of information in the error correction information with the lower code error rate, and to change the constituent ratio between Viterbi code and Reed-Solomon code. More specifically, a transmitter-side controller 43 decreases the amount of information in color data and increases the amount of information in the Viterbi code or the Reed-Solomon code, based on the result of comparison by the receiver-side controller 55. For example, when the wireless signal goes from the state in FIG. 9A to the state in FIG. 9B, the transmitter-side controller 43 controls so as to decrease the amount of information in color data, and to increase the amount of information in the Viterbi code by the same amount by which the amount of information in the color data was decreased. Also, when the wireless signal goes from the state in FIG. 9A to the state in FIG. 9C, the transmitter-side controller 43 controls so as to decrease the amount of information in the color data, and to increase the amount of information in the Reed-Solomon code by the same amount by which the amount of information in the color data was decreased.

Also, in the fourth embodiment, the transmitter-side controller 43 performs control to thin out approximately half of the color data. More specifically, when there is a change from the state in FIG. 9A to the state in FIG. 9B or 9C, the amount of information in the color data is changed from L1a to L1a/2.

That is, when there is a change from the state in FIG. 9A to the state in FIG. 9B, the amount of information in the Viterbi code goes from L2a to L2a+L1a/2. In this case, the amount of information in the Reed-Solomon code stays at L2b. When there is a change from the state in FIG. 9A to the state in FIG. 9C, the amount of information in the Reed-Solomon code goes from L2b to L2b+L1a/2. In this case, the amount of information in the Viterbi code stays at L2a.

Also, in the fourth embodiment, the transmitter-side controller 43 (see FIG. 1) performs control so that the amount of information in the brightness data is not changed. More specifically, when the wireless signal goes from the state in FIG. 9A to the state in FIG. 9B, or to the state in FIG. 9C, the amount of information in the content data is decreased by the same amount by which the color data was decreased. That is, the amount of information in the content data is decreased from L1 to L1−L1a/2.

Figure 10:
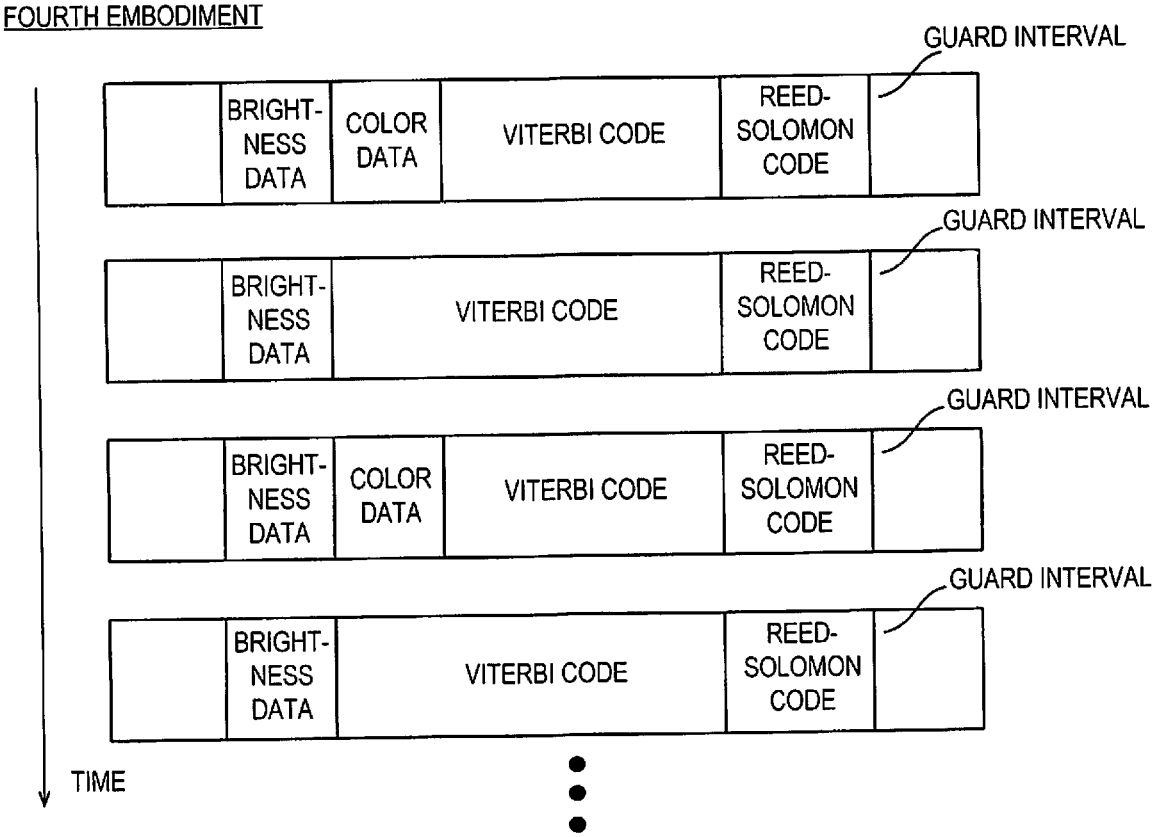
FIG. 10 illustrates the method for receiving wireless signals in the fourth embodiment of the present disclosure.

Also, in the fourth embodiment, as shown in FIG. 10, the transmitter-side controller 43 (see FIG. 1) performs control to alternately repeat thinning and not thinning of the color data that is continuously transmitted in specific units by a transmitter-side wireless communication component 40 (see FIG. 1). More specifically, after a specific unit of wireless signal in which the color data is not thinned out has been transmitted by the transmitter-side wireless communication component 40, a specific unit of wireless signal in which the color data has been thinned out is transmitted, and this is repeated until all of the content data is transmitted. In this case, the transmitter-side controller 43 increases the amount of information in the Viterbi code or the Reed-Solomon code (Viterbi code in FIG. 10) by the same amount as the amount of thinned out color data.

The rest of the configuration of the fourth embodiment is the same as in the first embodiment above.

Effect of Fourth Embodiment

The following effect can be obtained with the fourth embodiment.

In the fourth embodiment, as discussed above, the content data includes brightness data expressing the brightness of the video (content) and color data expressing the color of the video. The receiver-side wireless communication component 1 receives from the wireless transmitter 800 the wireless signal (first wireless signal) in which the amount of information in the Viterbi code has been increased and the amount of the color data has been decreased so as not to change the total amount of the content data and the encoded data and the wireless signal (second wireless signal) in which the amount of the information in the Reed-Solomon code has been increased and the amount of the color data has been decreased so as not to change the total amount of the content data and the encoded data. The receiver-side controller 55 gives priority to one of the Viterbi code and the Reed-Solomon code with a lower code error rate, by comparing the code error rate of the wireless signals (first and second wireless signals) with each other. Specifically, the wireless receiver 700 is configured so that the receiver-side controller 55 performs control to compare the code error rate when the amount of information in the Viterbi code is increased and the code error rate when the amount of information in the Reed-Solomon code is increased, in a case in which the amount of information in the color data has been decreased by thinning out part of the color data, and thereby to increase the amount of information in the error correction information with the lower code error rate, and to acquire information for changing the constituent ratio of Viterbi code and Reed-Solomon code, so as not to change the total amount of information in the content data and the encoded data. The human eye is not very sensitive to changes in color. Therefore, the error correction performance can be improved while suppressing a decrease in the wireless signal reception speed and a change in the video that is perceptible to a human, by increasing the amount of information in the Viterbi code and/or the Reed-Solomon code and thinning out the color data, so as not to change the total amount of information in the content data and the encoded data.

Also, in the fourth embodiment, as discussed above, the transmitter-side controller 43 decreases the amount of the color data and increases one of the amounts of information in the Viterbi code and the Reed-Solomon code so as not to change the total amount of the content data and the encoded data. Specifically, the wireless transmitter 800 is configured such that the transmitter-side controller 43 performs control to decrease the amount of information in the color data by thinning out part of the color data, and to increase the amount of information in the Viterbi code and/or the Reed-Solomon code, so as not to change the total amount of information in the content data and the encoded data. Consequently, since there is no change in the total amount of information in the content data and the encoded data, a decrease in the rate at which the wireless signal is transmitted can be suppressed.

Also, in the fourth embodiment, as discussed above, the transmitter-side controller 43 decreases approximately half of the color data. Specifically, the wireless transmitter 800 is configured such that the transmitter-side controller 43 performs control to thin out approximately half of the color data. If only about half of the color data is thinned out, the change in the video will be hard to discern to the human eye. Therefore, the error correction performance can be further enhanced while suppressing a change in the video that is perceptible to the human eye, by thinning out approximately half of the color data.

Also, in the fourth embodiment, as discussed above, the wireless transmitter 800 is configured such that the transmitter-side controller 43 performs control to alternately repeat thinning out the color data and not thinning out the color data in the wireless signal that is continuously transmitted in specific units by the transmitter-side wireless communication component 40. Consequently, since a specific unit of wireless signal in which the color data is being thinned out will not be continuously transmitted, a change in the video that is perceptible to a human can be easily suppressed.

Also, in the fourth embodiment, as discussed above, the wireless transmitter 800 is configured such that the transmitter-side controller 43 performs control so as not to change the amount of information in the brightness data. The human eye is very sensitive to changes in brightness. Therefore, a change in the video that is perceptible to a human can be effectively suppressed by not changing the amount of information in the brightness data.

The rest of the effect of the fourth embodiment is the same as that in the first embodiment above.

Fifth Embodiment

The configuration of a wireless transmitter 900 pertaining to a fifth embodiment will now be described through reference to FIG. 11. The wireless transmitter 900 in this fifth embodiment differs from the second embodiment, in which data was transmitted only after notifying the wireless receiver 300 of a change in the settings (such as the code error rate), in that it is configured so that the notification of a change in the settings (such as the code error rate) is carried out simultaneously with data transmission. En the drawings, those components that are the same as in the second embodiment above are numbered the same.

In the fifth embodiment, a transmitter-side controller 53 (see FIG. 1) is configured such that when a wireless signal is transmitted directly to the wireless receiver 300 (see FIG. 1), information related to the amount of information in the Viterbi code and the amount of information in the LDPC code is transmitted along with the transmission of the wireless signal. In this case, the wireless transmitter 900 (see FIG. 1) is connected to the wireless receiver 300 by WiFi-Direct, without a router being used. The transmitter-side controller 53 is an example of the "controller of the wireless transmitter" in the present disclosure.

Figure 11:
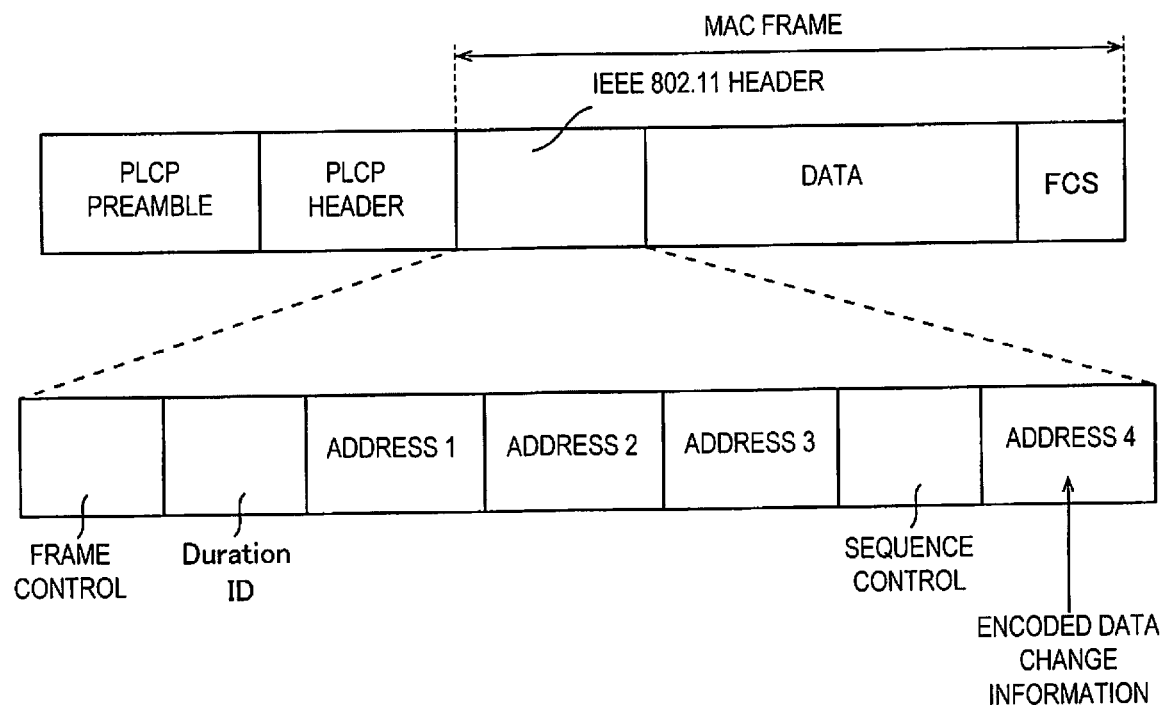
FIG. 11 illustrates the method for transmitting wireless signals in the fifth embodiment of the present disclosure.

As shown in FIG. 11, the IEEE 802.11 frame (wireless LAN frame) format is constituted by a PLCP preamble, a PLCP header, and a MAC frame. The MAC frame is constituted by an IEEE 802.11 header, data, and an FCS.

The IEEE 802.11 header is constituted by a frame protocol, a duration ID, addresses 1 to 4, and a sequence control. Here, if connection to the wireless receiver 300 (see FIG. 1) is made via a router, the router address will need to be put in the address 4. If connection is made by WiFi-Direct without using a router, since there is no need to put a router address in the address 4, the transmitter-side controller 53 (see FIG. 1) performs control so that information related to setting changes to the amount of information in the Viterbi code and the amount of information in the LDPC code, etc., is put into the address 4.

The rest of the configuration of the fifth embodiment is the same as in the second embodiment above.

Effect of Fifth Embodiment

The following effect can be obtained with the fifth embodiment.

In the fifth embodiment, as discussed above, the transmitter-side controller 53 transmits information regarding the amount of information in the Viterbi code and the amount of information in the LDPC code along with the wireless signal when the wireless signal is transmitted directly to the wireless receiver 300. Specifically, the wireless transmitter 900 is configured such that when a wireless signal is transmitted directly to the wireless receiver 300, the transmitter-side controller 53 transmits information related to the amount of information in the Viterbi code and the amount of information in the LDPC code along with the transmission of the wireless signal. Here, if the wireless signal is transmitted indirectly, via a router or the like, to the wireless receiver 300, then the transmission of the wireless signal including address information for the router, etc., is carried out after sending the wireless receiver 300 information related to the amount of information in the Viterbi code and the amount of information in the LDPC code. On the other hand, if the wireless signal is transmitted directly to the wireless receiver 300 without the use of a router, etc., then there is no need to send address information for the router, etc., to the wireless receiver 300. Therefore, when the wireless signal is transmitted directly to the wireless receiver 300 without the use of a router, etc., a wireless signal that includes information related to the amount of information in the Viterbi code and the amount of information in the LDPC code is transmitted instead of address information for the router, etc., which allows the wireless signal to be transmitted more quickly than when it is transmitted indirectly via a router or the like to the wireless receiver 300.

The rest of the effect of the fifth embodiment is the same as that in the second embodiment above.

MODIFICATION EXAMPLES

The embodiments disclosed herein are merely examples in all respects, and should not be construed as being limiting in nature. The scope of the invention being indicated by the claims rather than by the above description of the embodiments, all modifications (modification examples) within the meaning and range of the appended claims and their equivalents are included.

For example, in the first to fifth embodiments above, an example is given in which the amount of information in the guard interval is not changed, but the present invention is not limited to this. For instance, the amount of information in the guard interval can be changed.

Also, in the third embodiment above, an example is given in which the wireless receiver 500 and the wireless transmitter 600 are connected via a router, but the present invention is not limited to this. In the third embodiment, just as in the fifth embodiment, the wireless receiver 500 and the wireless transmitter 600 can be connected by WiFi-Direct. Connection by WiFi-Direct can also be applied in the first and fourth embodiments.

Also, in the first and fourth embodiments above, an example is given in which the first error correction information is Viterbi code and the second error correction information is Reed-Solomon code, but the present invention is not limited to this. For example, the first error correction information can be TC8PSK (trellis coded 8PSK) code, and the second error correction information can be Reed-Solomon code.

Also, in the first and fourth embodiments above, an example is given in which the wireless signal is a digital broadcast signal, but the present invention is not limited to this. For example, the wireless signal can be a signal produced by a wireless LAN, a wireless MAN (metropolitan area network), a wireless PAN (personal area network), satellite communication, or mobile communication.

Also, in the second, third, and fifth embodiments above, an example is given in which the wireless signal is a signal produced by a wireless LAN, but the present invention is not limited to this. For example, the wireless signal can be a signal produced by digital broadcast, a wireless MAN, a wireless PAN, satellite communication, or mobile communication.

Also, in the first embodiment above, an example is given in which the amount of information in either Viterbi code or Reed-Solomon code is increased and the amount of information in the other is decreased, but the present invention is not limited to this. For example, the amount of information in either Viterbi code or Reed-Solomon code can be increased and the amount of information in the other not changed. Also, the amount of information in both the Viterbi code and the Reed-Solomon code can be increased. Also, the amount of information in both the Viterbi code and the Reed-Solomon code can be decreased.

Also, in the fourth embodiment above, an example is given in which the amount of information in either the Viterbi code or the Reed-Solomon code is increased, and the amount of information in the other is not changed, but the present invention is not limited to this. For example, the amount of information in either the Viterbi code or the Reed-Solomon code can be increased, and the amount of information in the other can be decreased. In this case, control can be performed so that the amount of information in the encoded data does not change. Also, the amount of information in both the Viterbi code and the Reed-Solomon code can be increased.

Also, in the first, second, fourth, and fifth embodiments above, an example is given in which a single receiver-side antenna 7 and a single transmitter-side antenna 15 are provided, but the present invention is not limited to this. For example, just as in the third embodiment, a plurality of (such as two) of each of these antennas can be provided.

Also, in the fourth embodiment above, an example is given in which thinning out and not thinning out the color data are alternately repeated, but the present invention is not limited to this. For example, a pattern can be repeated in which the color data is thinned out two times in a row, and then is not thinned out two times in a row.

Also, in the fourth embodiment above, an example is given in which half of the color data is thinned out, but the present invention is not limited to this. For example, one-third of the color data can be thinned out.

Also, in the first to fifth embodiments above, an example is given in which the amount of information in the error correction information is controlled based on the code error rate of the wireless signal, but the present invention is not limited to this. For example, the amount of information in the error correction information can be controlled based on the CN ratio of the wireless signal.

Also, in the first and fourth embodiments above, an example is given in which the amount of information in either the Viterbi code or the Reed-Solomon code is increased, and the one with the lower code error rate is selected, but the present invention is not limited to this. For example, even if the amount of information in either the Viterbi code or the Reed-Solomon code is increased, as long as the code error rate is at or over a specific threshold, control can be performed to increase the amount of information in either the Viterbi code or the Reed-Solomon code once again.

Also, in the third embodiment above, an example is given in which the amount of information in the error correction information is controlled when the code error rate of the wireless signal received by the receiver-side wireless communication component 31a via the first receiver-side antenna 17a and the code error rate of the wireless signal received by the receiver-side wireless communication component 31b via the second receiver-side antenna 17b are each at or over a specific threshold, but the present invention is not limited to this. For example, the configuration can be such that if either the code error rate of the wireless signal received via the first receiver-side antenna 17a or the code error rate of the wireless signal received via the second receiver-side antenna 17b is at or over a specific threshold, the wireless signal whose code error rate is at or over the specific threshold is changed to the other wireless signal whose code error rate is less than the specific threshold.

Also, in the second and third embodiments above, an example is given in which control is performed so as not to change the amount of information of the encoded data in the control of the encoded data, but the present invention is not limited to this. For example, when the encoded data is controlled, the amount of information of the encoded data can be changed.

Also, in the third embodiment above, an example is given in which the wireless receiver 500 and the wireless transmitter 600 each have two antennas, but the present invention is not limited to this. For example, the wireless receiver 500 and the wireless transmitter 600 can each have three or more antennas.

Also, in the first to fifth embodiments above, a flow driven type of flowchart, in which processing follows the order of processing flow, is used to describe the control processing in the present disclosure for the sake of convenience, but the present invention is not limited to this. In the present invention, the control processing operation can be carried out by an event driven type of processing in which the processing is executed for every event. In this case, the processing can be completely event driven, or can be a combination of event driven and flow driven.

[1] In view of the state of the known technology and in accordance with an aspect of the present disclosure, a wireless receiver comprises a wireless communication component and a controller. The wireless communication component is configured to receive from a wireless transmitter a wireless signal that includes content data and encoded data having first error correction information and second error correction information of a different type from that of the first error correction information, for correcting errors in the content data. The controller is configured to determine which of the first error correction information and the second error correction information is to be given priority based on the signal quality of the wireless signal. For example, the controller is configured to perform control to acquire information for adjusting the amount of the first error correction information and the amount of the second error correction information based on the signal quality of the wireless signal.

With this wireless receiver, as mentioned above, the encoded data has first error correction information and second error correction information, which allows a number of different types of error to be properly corrected by adjusting the amount of the first error correction information and the amount of the second error correction information and thereby acquiring information for effectively performing error correction on the error that has occurred.

With the wireless receiver pertaining to the above-mentioned aspect, the controller is configured to perform control to acquire information for increasing the amount of first error correction information and/or the amount of second error correction information, based on the signal quality of the wireless signal. With this configuration, the error correction capability for a number of different types of error can be easily increased by acquiring information for increasing the amount of first error correction information and/or the amount of second error correction information, so the signal quality of a wireless signal can be effectively improved by better performing error correction.

[2] In accordance with a preferred embodiment according to the wireless receiver mentioned above, the signal quality of the wireless signal includes code error rate of the wireless signal. For example, the controller is configured to perform control to acquire information for changing the amount of first error correction information and/or the amount of second error correction information, based on the code error rate of the wireless signal. When noise, etc., is mixed into a wireless signal, it profoundly affects the code error rate. Therefore, proper error correction can be easily carried out by controlling the error correction based on the code error rate of a wireless signal.

[3] In accordance with a preferred embodiment according to any one of the wireless receivers mentioned above, the controller is configured to determine which of the first error correction information and the second error correction information is to be given priority when the code error rate is at or over a specific threshold. For example, the controller is configured to perform control to acquire information for increasing the amount of first error correction information and/or the amount of second error correction information when the code error rate is at or over a specific threshold. With this configuration, the code error rate of a wireless signal can be easily improved.

[4] In accordance with a preferred embodiment according to any one of the wireless receivers mentioned above, the wireless communication component is configured to receive from the wireless transmitter a first wireless signal in which an amount of the first error correction information has been increased and a second wireless signal in which an amount of the second error correction information has been increased. The controller is configured to give priority to one of the first error correction information and the second error correction information with a lower code error rate, by comparing code error rate of the first wireless signal with code error rate of the second wireless signal. For example, with the above-mentioned wireless receiver in which information for increasing the amount of first error correction information and/or the amount of second error correction information is acquired when the code error rate is at or over a specific threshold, the controller is configured to perform control to compare the code error rate when the amount of first error correction information has been increased with the code error rate when the amount of second error correction information has been increased, and thereby to acquire information for increasing the information amount of the error correction information with the lower code error rate, and for changing the constituent ratio of the first error correction information and the second error correction information. With this configuration, it can be determined whether it is more effective to increase the amount of first error correction information or to increase the amount of second error correction information for an error that has occurred, so the error correction capability can be further enhanced.

[5] In accordance with a preferred embodiment according to any one of the wireless receivers mentioned above, the wireless communication component is configured to receive from the wireless transmitter a first wireless signal in which an amount of the first error correction information has been increased and an amount of the second error correction information has been decreased so as not to change an amount of information in the encoded data and a second wireless signal in which the amount of the first error correction information has been decreased and the amount of the second error correction information has been increased so as not to change the amount of information in the encoded data. The controller is configured to give priority to one of the first error correction information and the second error correction information with a lower code error rate, by comparing code error rate of the first wireless signal with code error rate of the second wireless signal. For example, the controller is configured to perform control to compare the code error rate when the amount of first error correction information has been increased and the amount of second error correction information has been decreased so as not to change the amount of information in the encoded data with the code error rate when the amount of first error correction information has been decreased and the amount of second error correction information has been increased so as not to change the amount of information in the encoded data, and thereby to acquire information for changing the constituent ratio of the first error correction information and the second error correction information. With this configuration, since the amount of information in the encoded data does not change, the proper error correction can be carried out making it less likely that the speed at which the wireless signal is received will decrease.

[6] In accordance with a preferred embodiment according to any one of the wireless receivers mentioned above, the wireless communication component is configured to receive from the wireless transmitter a first wireless signal in which an amount of the first error correction information has been increased and an amount of the second error correction information has been lowered to approximately zero so as not to change an amount of information in the encoded data and a second wireless signal in which the amount of the second error correction information has been increased and the amount of the first error correction information has been lowered to approximately zero so as not to change the amount of information in the encoded data. The controller is configured to give priority to one of the first error correction information and the second error correction information with a lower code error rate, by comparing code error rate of the first wireless signal with code error rate of the second wireless signal. For example, with a wireless receiver in which the constituent ratio of first error correction information and second error correction information is changed so as not to change the amount of information in the encoded data, the controller is configured to perform control to compare the code error rate when the amount of first error correction information has been lowered to approximately zero and the amount of second error correction information has been increased so as not to change the amount of information in the encoded data with the code error rate when the amount of second error correction information has been lowered to approximately zero and the amount of first error correction information has been increased so as not to change the amount of information in the encoded data, and thereby to acquire information for changing the constituent ratio of the first error correction information and the second error correction information. With this configuration, the error correction capability can be more effectively increased when an active error has occurred only in the first error correction information or the second error correction information.

[7] In accordance with a preferred embodiment according to any one of the wireless receivers mentioned above, the wireless receiver further comprises a plurality of antennas (such as a multiple-input multiple-output (MIMO) of a wireless LAN) configured to receive a plurality of sets of the encoded data at substantially the same time. The controller is configured to select a set of the encoded data with the lowest code error rate by comparing code error rates for the sets of the encoded data received by the antennas. For example, the controller is configured to perform control to compare the code error rate for the sets of the encoded data received by the antennas, and thereby to acquire information for selecting the encoded data with the lowest code error rate. With this configuration, a plurality of sets of encoded data can be received substantially at the same time by the plurality of antennas, as opposed to when a plurality of sets of encoded data are received continuously. As a result, the code error rates of the sets of encoded data can be easily and quickly compared.

[8] In accordance with a preferred embodiment according to any one of the wireless receivers mentioned above, the controller is configured to notify the wireless transmitter of information regarding which of the first error correction information and the second error correction information is to be given priority. For example, the controller is configured so that the wireless transmitter side will be notified of information for adjusting the amount of first error correction information and the amount of second error correction information that have been acquired. With this configuration, since an information notification signal can be transmitted to the wireless transmitter side upon completion of the acquisition of information by the controller, it is less likely that there will be a time difference between the completion of the acquisition of information by the controller and the notification of information to the wireless transmitter side.

[9] In view of the state of the known technology and in accordance with another aspect of the present disclosure, a wireless transmitter comprises a wireless communication component and a controller. The wireless communication component is configured to transmit to a wireless receiver a wireless signal that includes content data and encoded data having first error correction information and second error correction information of a different type from that of the first error correction information, for correcting errors in the content data. The controller is configured to adjust an amount of the first error correction information and an amount of the second error correction information based on information regarding which of the first error correction information and the second error correction information is to be given priority, acquired by the wireless receiver. For example, the controller is configured to perform control to adjust the amount of first error correction information and the amount of second error correction information based on information for adjusting the amount of first error correction information and the amount of second error correction information acquired by the wireless receiver based on the signal quality of the wireless signal.

With the wireless transmitter pertaining to the above-mentioned aspect, as discussed above, the encoded data has first error correction information and second error correction information, which allows effective error correction to be performed on an error that has occurred by adjusting the amount of first error correction information and the amount of second error correction information according to the type of error that has occurred. Also, the error correction can be carried out properly by feeding back the signal quality of the wireless signal acquired by the wireless receiver, and adjusting the amount of first error correction information and the amount of second error correction information.

[10] In accordance with a preferred embodiment according to the wireless transmitter mentioned above, the controller is configured to change an ratio of the amount of the first error correction information and the amount of the second error correction information based on the information regarding which of the first error correction information and the second error correction information is to be given priority, acquired by the wireless receiver.

[11] In accordance with a preferred embodiment according to any one of the wireless transmitters mentioned above, the controller is configured to change an ratio of the amount of the first error correction information and the amount of the second error correction information so as not to change an amount of information in the encoded data based on the information regarding which of the first error correction information and the second error correction information is to be given priority, acquired by the wireless receiver.

[12] In accordance with a preferred embodiment according to any one of the wireless transmitters mentioned above, the controller is configured to increase one of the amounts of the first error correction information and the second error correction information and lower the other one of the amounts of the first error correction information and the second error correction information to approximately zero so as not to change an amount of information in the encoded data based on the information regarding which of the first error correction information and the second error correction information is to be given priority, acquired by the wireless receiver.

[13] In accordance with a preferred embodiment according to any one of the wireless transmitters mentioned above, the controller is configured to notify the wireless receiver of a setting change in the encoded data.

[14] In accordance with a preferred embodiment according to any one of the wireless transmitters mentioned above, the wireless transmitter further comprises a plurality of antennas configured to transmit a plurality of sets of the encoded data at substantially the same time. The controller is configured to select a set of the encoded data with the lowest code error rate based on information regarding which of the first error correction information and the second error correction information is to be given priority, acquired by the wireless receiver. For example, the controller is configured to perform control to select the encoded data with the lowest code error rate out of the plurality of sets of encoded data, based on information for adjusting the amount of first error correction information and the amount of second error correction information, acquired by the wireless receiver based on the signal quality of the wireless signal. With this configuration, a plurality of sets of encoded data can be transmitted at substantially the same time, as opposed to when a plurality of sets of encoded data are transmitted continuously. As a result, a plurality of sets of encoded data can be transmitted quickly.

[15] In accordance with a preferred embodiment according to any one of the wireless transmitters mentioned above, the controller is configured to transmit information regarding the amount of the first error correction information and the amount of the second error correction information along with the wireless signal when the wireless signal is transmitted directly to the wireless receiver. For example, the controller is configured so that when the wireless signal is transmitted directly to the wireless receiver, information related to the amount of first error correction information and the amount of second error correction information is transmitted along with the transmission of the wireless signal. Here, when a wireless signal is transmitted indirectly via a router or the like to the wireless receiver, the transmission of the wireless signal containing information about the address of the router or the like is performed after information related to the amount of first error correction information and the amount of second error correction information is sent to the wireless receiver. On the other hand, when a wireless signal is transmitted directly to the wireless receiver, without any router or the like in between, there is no need to send the wireless receiver information about the address of a router or the like. Therefore, when a wireless signal is transmitted directly to the wireless receiver, without any router or the like in between, a wireless signal that contains information related to the amount of first error correction information and the amount of second error correction information is transmitted instead of information about the address of a router or the like, which allows the wireless signal to be transmitted more quickly than when a wireless signal is transmitted indirectly to the wireless receiver via a router or the like.

[16] In accordance with a preferred embodiment according to any one of the wireless receivers mentioned above, the content data includes brightness data expressing brightness of content, and color data expressing color of the content.

[17] In accordance with a preferred embodiment according to any one of the wireless receivers mentioned above, the wireless communication component is configured to receive from the wireless transmitter a first wireless signal in which an amount of the first error correction information has been increased and an amount of the color data has been decreased so as not to change a total amount of the content data and the encoded data and a second wireless signal in which an amount of the second error correction information has been increased and the amount of the color data has been decreased so as not to change the total amount of the content data and the encoded data. The controller is configured to give priority to one of the first error correction information and the second error correction information with a lower code error rate, by comparing code error rate of the first wireless signal with code error rate of the second wireless signal.

[18] In accordance with a preferred embodiment according to any one of the wireless transmitters mentioned above, the content data includes brightness data expressing brightness of content, and color data expressing color of the content.

[19] In accordance with a preferred embodiment according to any one of the wireless transmitters mentioned above, the controller is configured to decrease the amount of the color data and increase one of the amounts of the first error correction information and the second error correction information so as not to change a total amount of the content data and the encoded data.

[20] In accordance with a preferred embodiment according to any one of the wireless transmitters mentioned above, the controller is configured to decrease approximately half of the color data.

As discussed above, the present disclosure provides a wireless receiver and a wireless transmitter with which error correction can be carried out properly for a number of error types.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A wireless receiver comprising:
a wireless communication component that receives from a wireless transmitter a first wireless signal that includes content data and encoded data having at least first error correction information for correcting errors in the content data, and a second wireless signal that includes the content data and encoded data having at least second error correction information of a different type from that of the first error correction information for correcting errors in the content data; and
a controller that calculates code error rate of the first wireless signal, notifies the wireless transmitter for changing the first wireless signal to the second wireless signal, calculates code error rate of the second wireless signal, compares the code error rate of the first wireless signal with the code error rate of the second wireless signal, determines which of the first error correction information and the second error correction information is to be given priority, based on a comparison result, and notifies the wireless transmitter of a determination result.

2. The wireless receiver according to claim 1, wherein the controller determines which of the first error correction information and the second error correction information is to be given priority when the code error rate of the first wireless signal is at or over a specific threshold.

3. The wireless receiver according to claim 1, wherein the first wireless signal is a wireless signal in which an amount of the first error correction information has been increased and the second wireless signal is a wireless signal in which an amount of the second error correction information has been increased, and the controller gives priority to one of the first error correction information and the second error correction information with a lower code error rate, by comparing the code error rate of the first wireless signal with the code error rate of the second wireless signal.

4. The wireless receiver according to claim 1, wherein the first wireless signal is a wireless signal in which an amount of the first error correction information has been increased and an amount of the second error correction information has been decreased so as not to change an amount of information in the encoded data and the second wireless signal is a wireless signal in which the amount of the first error correction information has been decreased and the amount of the second error correction information has been increased so as not to change the amount of information in the encoded data, and the controller gives priority to one of the first error correction information and the second error correction information with a lower code error rate, by comparing the code error rate of the first wireless signal with the code error rate of the second wireless signal.

5. The wireless receiver according to claim 1, wherein the first wireless signal is a wireless signal in which an amount of the first error correction information has been increased and an amount of the second error correction information has been lowered to zero so as not to change an amount of information in the encoded data and the second wireless signal is a wireless signal in which the amount of the second error correction information has been increased and the amount of the first error correction information has been lowered to zero so as not to change the amount of information in the encoded data, and the controller gives priority to one of the first error correction information and the second error correction information with a lower code error rate, by comparing the code error rate of the first wireless signal with the code error rate of the second wireless signal.

6. A wireless receiver comprising:
a wireless communication component that receives from a wireless transmitter a wireless signal that includes content data and encoded data having first error correction information and second error correction information of a different type from that of the first error correction information, for correcting errors in the content data;
a controller that determines which of the first error correction information and the second error correction information is to be given priority, based on signal quality of the wireless signal; and
a plurality of antennas that receives a plurality of sets of the encoded data at the same time, respectively, the controller selecting a set of the encoded data with the lowest code error rate by comparing code error rates for the sets of the encoded data received by the antennas, respectively, and notifying the wireless transmitter of information indicating an antenna corresponding to the set of the encoded data with the lowest code error rate.

7. The wireless receiver according to claim 1, wherein the controller notifies the wireless transmitter of information regarding which of the first error correction information and the second error correction information is to be given priority as the determination result.

8. A wireless transmitter comprising:
a wireless communication component that transmits to a wireless receiver a first wireless signal that includes content data and encoded data having at least first error correction information for correcting errors in the content data and a second wireless signal that includes the content data and encoded data having at least second error correction information of a different type from that of the first error correction information for correcting errors in the content data; and
a controller that receives a notification from the wireless receiver for changing the first wireless signal to the second wireless signal from the wireless receiver, changes the first wireless signal to the second wireless signal in response to the notification, receives information regarding which of the first error correction information and the second error correction information is to be given priority from the wireless receiver, and adjusts an amount of the first error correction information and an amount of the second error correction information in a wireless signal based on the information regarding which of the first error correction information and the second error correction information is to be given priority.

9. The wireless transmitter according to claim 8, wherein the controller changes a ratio of the amount of the first error correction information and the amount of the second error correction information in a wireless signal based on the information regarding which of the first error correction information and the second error correction information is to be given priority.

10. The wireless transmitter according to claim 8, wherein the controller changes a ratio of the amount of the first error correction information and the amount of the second error correction information so as not to change an amount of information in encoded data of the wireless signal based on the information regarding which of the first error correction information and the second error correction information is to be given priority.

11. The wireless transmitter according to claim 8, wherein the controller increases one of the amounts of the first error correction information and the second error correction information and lower the other one of the amounts of the first error correction information and the second error correction information to zero so as not to change an amount of information in encoded data of the wireless signal based on the information regarding which of the first error correction information and the second error correction information is to be given priority.

12. The wireless transmitter according to claim 8, wherein the controller notifies the wireless receiver of a setting change in encoded data of the wireless signal.

13. A wireless transmitter comprising:
a wireless communication component that transmits to a wireless receiver a wireless signal that includes content data and encoded data having first error correction information and second error correction information of a different type from that of the first error correction information, for correcting errors in the content data;

a controller that adjusts an amount of the first error correction information and an amount of the second error correction information based on information regarding which of the first error correction information and the second error correction information is to be given priority, acquired by the wireless receiver; and a plurality of antennas that transmits a plurality of sets of the encoded data at the same time, respectively, the controller receiving information indicating an antenna corresponding to a set of the encoded data with the lowest code error rate from the wireless receiver, and selecting the set of the encoded data with the lowest code error rate based on the information indicating the antenna corresponding to the set of the encoded data with the lowest code error rate.

14. The wireless transmitter according to claim 8, wherein the controller transmits information regarding the amount of the first error correction information and the amount of the second error correction information along with the wireless signal when the wireless signal is transmitted directly to the wireless receiver.

15. The wireless receiver according to claim 1, wherein the content data includes brightness data expressing brightness of content, and color data expressing color of the content.

16. The wireless receiver according to claim 15, wherein the first wireless signal is a wireless signal in which an amount of the first error correction information has been increased and an amount of the color data has been decreased so as not to change a total amount of the content data and the encoded data and the second wireless signal is a wireless signal in which an amount of the second error correction information has been increased and the amount of the color data has been decreased so as not to change the total amount of the content data and the encoded data, and the controller gives priority to one of the first error correction information and the second error correction information with a lower code error rate, by comparing the code error rate of the first wireless signal with the code error rate of the second wireless signal.

17. The wireless transmitter according to claim 8, wherein the content data includes brightness data expressing brightness of content, and color data expressing color of the content.

18. The wireless transmitter according to claim 17, wherein the controller decreases the amount of the color data and increase one of the amounts of the first error correction information and the second error correction information so as not to change a total amount of the content data and the encoded data in the first wireless signal and the second wireless signal.

19. The wireless transmitter according to claim 18, wherein the controller decreases half of the color data.

* * * * *